United States Patent
Usui

(10) Patent No.: US 7,240,308 B2
(45) Date of Patent: Jul. 3, 2007

(54) SIMULATION METHOD FOR SEMICONDUCTOR CIRCUIT DEVICE AND SIMULATOR FOR SEMICONDUCTOR CIRCUIT DEVICE

(75) Inventor: Hiroki Usui, Kanagawa (JP)

(73) Assignee: Sony Corporation (JP)

( * ) Notice: Subject to any disclaimer, the term of this patent is extended or adjusted under 35 U.S.C. 154(b) by 357 days.

(21) Appl. No.: 10/502,621

(22) PCT Filed: Dec. 19, 2003

(86) PCT No.: PCT/JP03/16385

§ 371 (c)(1),
(2), (4) Date: Jul. 26, 2004

(87) PCT Pub. No.: WO2004/057652

PCT Pub. Date: Jul. 8, 2004

(65) Prior Publication Data

US 2005/0138581 A1   Jun. 23, 2005

(30) Foreign Application Priority Data

Dec. 19, 2002   (JP) .............................. 2002-368046

(51) Int. Cl.
   *G06F 17/50*   (2006.01)
(52) U.S. Cl. ................. 716/5; 716/2; 716/18
(58) Field of Classification Search ................. 716/4–6, 716/2, 18
   See application file for complete search history.

(56) References Cited

U.S. PATENT DOCUMENTS

| | | | | |
|---|---|---|---|---|
| 6,587,994 B1 * | 7/2003 | Yamaji | ........................... | 716/4 |
| 6,594,625 B2 * | 7/2003 | Hayashi | ........................ | 703/2 |
| 6,795,802 B2 * | 9/2004 | Yonezawa et al. | ............ | 703/19 |
| 2003/0200071 A1 * | 10/2003 | Zhang et al. | .................. | 703/15 |

FOREIGN PATENT DOCUMENTS

| | | |
|---|---|---|
| JP | 2000-323709 A | 11/2000 |
| JP | 2001-308317 A | 11/2001 |

* cited by examiner

*Primary Examiner*—Jack Chiang
*Assistant Examiner*—Binh Tat
(74) *Attorney, Agent, or Firm*—Lerner, David, Littenberg, Krumholz & Mentlik, LLP

(57) ABSTRACT

A simulator and method for accurately simulating a deterioration amount and a recovery amount of transistor characteristics, by which a semiconductor device can be designed with high reliability, in which when a negative bias fate voltage is applied to a gate of the transistor, characteristics of the transistor are deteriorated. When the negative bias voltage is terminated by applying a bias free voltage, the deteriorated transistor characteristics are recovered. In a deterioration period and a recovery period, a logarithm "log(t)" is obtained for an application time "t" of the gate voltage, a deterioration amount $\Delta P_D(t)=C_D+B_D \cdot \log(t)$ is calculated by using constants $C_D$ and $B_D$ depending on the negative bias voltage, a recovery amount $\Delta P_R(t)=C_R+B_R \cdot \log(t)$ is calculated by using constants $C_R$ and $B_R$ depending on the bias free voltage, and the deterioration amount ($\Delta P_D$), the recovery amount ($\Delta P_R$) and a basic deterioration amount ($X_D$) are summed up.

30 Claims, 12 Drawing Sheets

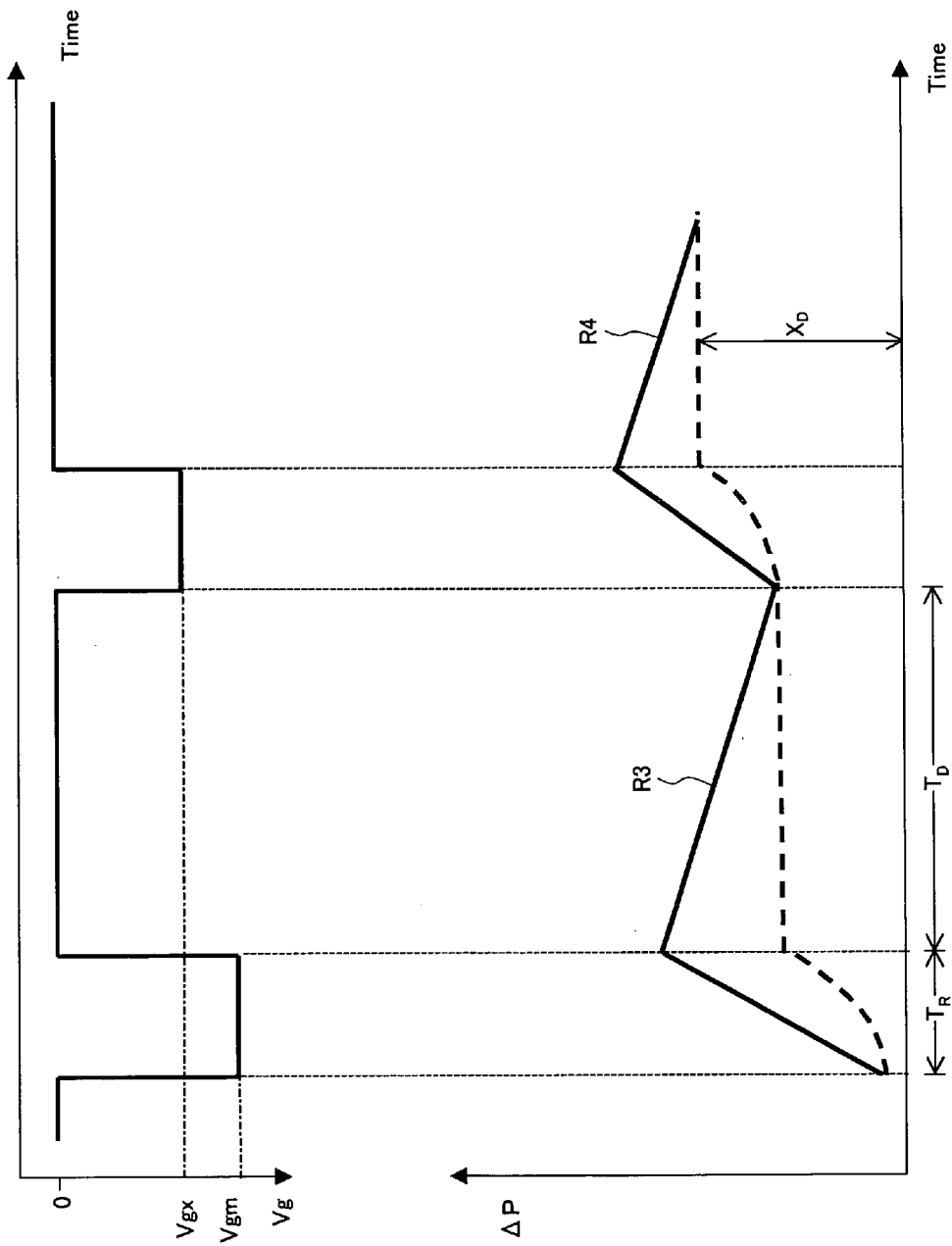

US 7,240,308 B2

SIMULATION METHOD FOR SEMICONDUCTOR CIRCUIT DEVICE AND SIMULATOR FOR SEMICONDUCTOR CIRCUIT DEVICE

TECHNICAL FIELD

The present invention relates to a simulation method of characteristics of a transistor and a semiconductor circuit device composed of a transistor, and a simulator of characteristics of a semiconductor circuit device for carrying out the method.

The present invention particularly relates to a simulation method of characteristics deterioration of an MIS (Metal Insulator Semiconductor) transistor and a semiconductor circuit device including an MIS transistor due to an NBTI (Negative Bias Temperature Instability) phenomenon, and a simulator for carrying out the method.

BACKGROUND ART

As a semiconductor integrated circuit device being developed to be high-density, high-integrated and miniaturized, development of a miniaturizing technique of dimensions of a semiconductor circuit device including a MIS transistor, etc., such as a MOS transistor, composing a semiconductor integrated circuit device is notable. Amid the technological development, reliability of a semiconductor circuit device including a MIS transistor, etc., such as a MOS transistor, has been a significant problem because of deterioration of transistor characteristics.

As the deterioration of MOS transistor characteristics, there is, for example, deterioration of a drain current over time. The deterioration of a drain current leads to deterioration of characteristics that a delay time of the circuit increases over time. When the increase of the delay time exceeds a certain degree, there is a possibility that a timing error of a signal input/output operation in the semiconductor integrated circuit or to/from the outside arises to cause an erroneous operation of the whole system incorporating the semiconductor integrated circuit.

Previously, hot carrier deterioration has been mainly studied in the characteristics deterioration of a MOS transistor. For example, the Japanese Unexamined Patent Publication No. 11-135388 and the Japanese Unexamined Patent Publication No. 2001-352059 describe contents on hot carrier deterioration.

A hot carrier deterioration phenomenon is a phenomenon that electrons and electron holes having high energy (hereinafter, referred to as a "hot carrier") are generated due to a strong electric field at a drain end of a MOS transistor and the hot carriers deteriorate characteristics of a gate oxide film.

The Lucky Electron model (hereinafter, referred to as the LE model) presented at the IEEE in 1985, which is a currently used existing technique for simulating hot carrier deterioration, is expressed by the formula 1 below and is a method of calculating a characteristics deterioration model limited to one phenomenon regarding hot electrons having high energy due to the strong electric field.

$$\Delta P = \left( \text{time} \cdot \frac{Ids}{w} \left( \frac{Ib}{Ids} \right)^m \right)^n \quad (1)$$

The "$\Delta P$" indicates a deterioration amount of transistor characteristics when time "time" has passed, the "Ids" indicates a source/drain current of the transistor, the "Ib" indicates a substrate current, the "w" indicates a channel width, and the "m" and "n" are constants.

Previously, transistor deterioration expressed by using the LE model, that is, transistor deterioration expressed by the source/drain current "Ids" and the substrate current "Id", was the most noteworthy deterioration phenomenon.

However, as MOS transistors getting miniaturized, a new deterioration phenomenon called NBTI (Negative Bias Temperature Instability) was found and acknowledged as a problem.

The NBTI deterioration phenomenon indicates a phenomenon that characteristics of a transistor, such as a drive ability, deteriorate when a negative voltage (a negative bias voltage) is continuously applied to a gate electrode of the transistor in the semiconductor substrate composing the transistor in a high temperature condition. Particularly, the characteristics deterioration due to the NBTI deterioration phenomenon is large in a MIS type transistor, such as a p-type MOS transistor having a surface channel structure wherein a nitride is used for a gate insulation film.

In a MOS transistor, the NBTI deterioration phenomenon is interpreted as a phenomenon caused by a high temperature condition of a balanced state of chemical reaction arisen on a boundary between a silicon substrate and an oxide silicon insulation film and changes due to application of a negative voltage.

In the NBTI deterioration phenomenon, the deterioration amount increases and decreases in a short time while deterioration of the transistor characteristics proceeds over time as a whole.

Studies for improving the structure of the transistor not to cause characteristics deterioration have been pursued on the NBTI deterioration phenomenon and, on an assumption of an existence of the NBTI deterioration phenomenon, an approach by a simulation for designing a semiconductor device with high reliability by accurately perceiving the details and calculating on the NBTI deterioration phenomenon has been also pursued.

However, the conventional simulation method, for example the LE model, is not capable of sufficiently dealing with changes of characteristics deterioration in the NBTI deterioration phenomenon, so that it is not sufficient for correctly estimating a deterioration amount due to the NBTI deterioration phenomenon and designing a semiconductor device or a semiconductor integrated circuit with high reliability. As a result, it is difficult to correctly setting a design margin in accordance with the characteristics deterioration of the transistor.

When the design margin is set to be larger than necessary, an area of the semiconductor chip may become large and an amount of a semiconductor chips produced from one wafer decreases. Thus, setting a larger margin than necessary has to be prevented as much as possible. On the other hand, when a necessary and sufficient design margin is not set, a lifetime of the semiconductor circuit device may become short.

However, in the conventional method, since changes of a direct current portion of the deterioration are not correctly expressed, it is pointed out that there is a high possibility that a deterioration amount in the NBTI deterioration phenomenon is overestimated. The direct current portion of the deterioration will be explained later on.

Furthermore, changes of transistor characteristics deterioration due to a temperature of the transistor on operations and application of a gate voltage of a negative level as a negative bias voltage in the NBTI deterioration phenomenon have not been known at all. However, when changes of transistor characteristics deterioration are not taken into consideration, there are problems that the NBTI deterioration phenomenon is not correctly perceived and the deterioration cannot be correctly estimated. For example, there is a possibility that the deterioration amount is underestimated or inversely overestimated.

DISCLOSURE OF THE INVENTION

An object of the present invention is to provide a method of correctly simulating a characteristics deterioration phenomenon of a circuit including a transistor by correctly estimating change of the characteristics deterioration amount when a transistor deterioration phenomenon is also taken into consideration.

Also, an object of the present invention is to provide a semiconductor characteristics simulator for effectively implementing the above simulation method.

Furthermore, an object of the present invention is to make it possible to produce a semiconductor circuit device effectively by designing a semiconductor circuit device having high reliability by using a result of the above simulation method and/or the semiconductor characteristics simulator.

According to a first aspect of the present invention, there is provided a simulation method of a semiconductor circuit device for simulating characteristics of a circuit when a negative bias voltage and a bias free voltage are applied to a semiconductor circuit device comprising a MIS transistor by using a calculation processing means, including a first step for obtaining a basic deterioration amount ($X_D$) of characteristics of said transistor depending on a negative bias voltage applied to said transistor, an operation temperature of said transistor, and a time passed after forming said transistor; a second step for calculating a deterioration amount ($\Delta P_D$) that said transistor deteriorates along with a duration of applying a negative bias voltage in a first period wherein said negative bias voltage is applied to said transistor; a third step for calculating a recovery amount ($\Delta P_R$) that characteristics of said deteriorated transistor along with a duration of a second period wherein application of said negative bias voltage to said transistor is terminated or a bias free voltage of a higher level than that of said negative bias voltage is applied to said transistor; and a fourth step for calculating a total deterioration amount (P) by adding said basic deterioration amount ($X_D$) and said deterioration amount ($\Delta P_D$) and subtracting said recovery amount ($\Delta P_R$) from the addition result.

Preferably, a change amount ($\exp(\beta(Vgj-Vg0)\times\Delta tj)$) of a deterioration amount up to a lifetime "1t" is calculated for each time zone ($\Delta tj$) obtained by dividing a passage of time to a plurality (j) of time zones, and a total deterioration amount (P) is calculated based on the formulas below.

$$time = e^{\frac{Q}{k}\left(\frac{1}{T0}-\frac{1}{T}\right)} \cdot e^{\alpha} \cdot \sum_{j=1}^{lt}(e^{\beta \cdot (Vgj-Vg0)} \cdot \Delta t_j)$$

$$P = C \cdot \sum_{k=1}^{} [time^n]_{time=stime_k}^{time=etime_k}$$

Note that "Q" is a constant indicating characteristics of a transistor,

"k" is the Boltzmann constant,

"T0" is a reference absolute operation temperature (K) of the transistor,

"T" is an absolute operation temperature of the transistor,

"$\alpha$" and "$\beta$" are constants obtained from experiments,

"Vg0" is a reference gate voltage,

"Vgj" is a gate voltage at time "j",

"C" is a constant, and

"1t" is a lifetime.

Also preferably, it is judged in said second step whether said transistor is deteriorated or not due to application of said negative bias voltage, and calculation of said deterioration amount ($\Delta P_D$) is executed when deterioration arises.

Calculation of a deterioration amount ($\Delta P_D$) is executed based on any of below.

$$\Delta PD(t)=CD+BD\times\log(t) \quad (1)$$

Note that "$C_D$" and "$B_D$" are constants defined by depending on a negative bias voltage, and defined by the formulas below, and "t" is a passage of time after applying the negative bias voltage.

$$C_D=C_{DV}e^{nCV/Vg}$$

$$B_D=B_{DV}e^{nBV/Vg}$$

or $$C_D=C_{DV}e^{\alpha CV+\beta CV \cdot Vg}$$

$$B_D=B_{DV}e^{\alpha BV+\beta BV \cdot Vg}$$

Note that "$C_{DV}$" and "$B_{DV}$" are constants obtained from experiments,

"$n_{cv}$" and "$n_{Bv}$" are constants obtained from experiments,

"$\alpha_{cv}$", "$\beta_{cv}$", "$\alpha_{Bv}$" and "$\beta_{Bv}$" are constants obtained from experiments, and "Vg" is a gate voltage as a negative bias voltage applied to the transistor.

$$\Delta PD(t)=CD+BD\times\log(t) \quad (2)$$

Note that "$C_D$" and "$B_D$" are constants defined by depending on a negative bias voltage, and defined by the formulas below, and "t" is a passage of time after applying the negative bias voltage.

$$C_D = C_{DV}\left(e^{\frac{nCV}{Vg}} \pm C_{DVP}e^{\frac{nCVP}{Vgp}}\right)$$

$$B_D = B_{DV}\left(e^{\frac{nBV}{Vg}} \pm B_{DVP}e^{\frac{nBVP}{Vgp}}\right)$$

Or $$C_D=C_{DV}(e^{\alpha CV+\beta CV \cdot Vg} \pm C_{DVP}e^{\alpha CVP+\beta CVP \cdot Vgp})$$

$$B_D=B_{DV}(e^{\alpha BV+\beta BV \cdot Vg} \pm B_{DVP}e^{\alpha BVP+\beta BVP \cdot Vgp})$$

Note that "$C_{DV}$" and "$B_{DV}$" are constants obtained from experiments,

"$n_{cv}$" and "$n_{Bv}$" are constants obtained from experiments,

"$\alpha cv$", "$\beta cv$", "$\alpha Bv$" and "$\beta Bv$" are constants obtained from experiments, and "Vg" is a gate voltage as a negative bias voltage applied to the transistor.

$$\Delta PD(t)=CD+BD\times\log(t) \quad (3)$$

Note that "$C_D$" and "$B_D$" are constants defined by depending on a negative bias voltage and a temperature of said transistor, and defined by the formulas below, and "t" is a passage of time after applying the negative bias voltage.

$$C_D = C_{DV} e^{n_{CV}/V_g}$$

$$B_D = B_{DV} e^{n_{BV}/V_g}$$

Or $$C_D = C_{DV} e^{\alpha_{CV} + \beta_{CV} \cdot V_g}$$

$$B_D = B_{DV} e^{\alpha_{BV} + \beta_{BV} \cdot V_g}$$

Note that "$C_{DV}$" and "$B_{DV}$" are constants defined by a temperature of said transistor in operation, and defined by the formulas below, "$n_{cv}$" and "$n_{Bv}$" are constants obtained from experiments, "$\alpha_{cv}$", "$\beta_{cv}$", "$\alpha_{Bv}$" and "$\beta_{Bv}$" are constants obtained from experiments, and "Vg" is a gate voltage as a negative bias voltage applied to the transistor.

$$C_{DV} = C_{DVT} e^{Q_{DC}/k \cdot (1/T0 - 1/T)}$$

$$B_{DV} = B_{DVT} e^{Q_{DB}/k \cdot (1/T0 - 1/T)}$$

Note that "$C_{DVT}$", "$Q_{DC}$", "$B_{DVT}$" and "$Q_{DB}$" are constants obtained from experiments, wherein "T" is an absolute operation temperature of the transistor, "T0" is a reference absolute operation temperature of the transistor, and "k" is the Boltzmann constant.

Preferably, it is judged in said third step whether recovery of deterioration of said transistor due to application of said bias free voltage arises or not, and calculation of the recovery amount ($\Delta P_R$) is executed when recovery arises.

Calculation of a recovery amount ($\Delta P_R$) is executed based on any of below.

$$\Delta PR = CR + BR \times \log(t) \quad (1)$$

Note that "$C_R$" and "$B_R$" are constants defined by the formulas below.

$$C_R = C_{RVM} e^{n_{CRVM}/V_{gm}}$$

$$B_R = B_{RVM} e^{n_{RBVM}/V_{gm}}$$

Or $$C_R = C_{RVM} e^{\alpha_{CRVM} + \beta_{CRVM} \cdot V_{gm}}$$

$$B_R = B_{RVM} e^{\alpha_{BRVM} + \beta_{BRVM} \cdot V_{gm}}$$

Note that "$C_{RVM}$" and "$B_{RVM}$" are constants obtained from experiments,

"$n_{CRVM}$" and "$n_{BRVM}$" are constants obtained from experiments,

"$\alpha_{cRVM}$" and "$\alpha_{BRVM}$" are constants obtained from experiments, "$\beta_{cRVM}$" and "$\beta_{BRVM}$" are constants obtained from experiments, and "Vgm" is a maximum gate voltage in a period of applying a negative bias voltage.

$$\Delta PR = CR + BR \times \log(t) \quad (2)$$

Note that "$C_R$" and "$B_R$" are constants defined by the formulas below.

$$C_R = C_{RVM}\left(e^{\frac{n_{CRVM}}{V_{gm}}} \pm C_{RV} e^{\frac{n_{CRV}}{V_g}}\right)$$

$$B_R = B_{RVM}\left(e^{\frac{n_{RBVM}}{V_{gm}}} \pm B_{RV} e^{\frac{n_{BRV}}{V_g}}\right)$$

Or $$C_R = C_{RVM}(e^{\alpha_{CRVM} + \beta_{CRVM} \cdot V_{gm}} \pm C_{RV} e^{\alpha_{CRV} + \beta_{CRV} \cdot V_g})$$

$$B_R = B_{RVM}(e^{\alpha_{BRVM} + \beta_{BRVM} \cdot V_{gm}} \pm B_{RVP} e^{\alpha_{BRV} + \beta_{BRV} \cdot V_g})$$

Note that "$C_{RVM}$" and "$B_{RVM}$" are constants obtained from experiments,

"$n_{CRVM}$" and "$n_{BRVM}$" are constants obtained from experiments,

"$\alpha_{cRVM}$" and "$\alpha_{BRVM}$" are constants obtained from experiments, "$\beta_{cRVM}$" and "$\beta_{BRVM}$" are constants obtained from experiments, "$\alpha_{cRV}$" and "$\alpha_{BRV}$" are constants obtained from experiments, "$\beta_{cRV}$" and "$\beta_{BRV}$" are constants obtained from experiments, and "Vgm" is a maximum gate voltage in a period of applying a negative bias voltage.

$$\Delta PR = CR + BR \times \log(t) \quad (3)$$

Note that "$C_R$" and "$B_R$" are constants defined by the formulas below.

$$C_R = C_{RVM} e^{n_{CRVM}/V_{gm}}$$

$$B_R = B_{RVM} e^{n_{RBVM}/V_{gm}}$$

Or $$C_R = C_{RVM} e^{\alpha_{CBVM} + \beta_{CRVM} \cdot V_{gm}}$$

$$B_R = B_{RVM} e^{\alpha_{BRVM} + \beta_{BRVM} \cdot V_{gm}}$$

Note that "$C_{RVM}$" and "$B_{RVM}$" are constants depending on a temperature of the transistor, and defined by the formulas below, "$n_{CRVM}$" and "$n_{BRVM}$" are constants obtained from experiments, "$\alpha_{cRVM}$" and "$\alpha_{BRVM}$" are constants obtained from experiments, "βcRVM" and "$\beta_{BRVM}$" are constants obtained from experiments, "Vgm" is a maximum gate voltage in a period of applying a negative bias voltage.

$$C_{RVM} = C_{RVMT} e^{Q_{RC}/k \cdot (1/T0 - 1/T)}$$

$$B_{RVM} = B_{RVMT} e^{Q_{RB}/k \cdot (1/T0 - 1/T)}$$

Note that "$C_{DVT}$", "$Q_{DC}$", "$B_{DVT}$" and "$Q_{DB}$" are constants obtained from experiments, wherein "T" is an absolute operation temperature of the transistor, "T0" is a reference absolute operation temperature of the transistor, and "k" is the Boltzmann constant.

Preferably, when characteristics of said transistor is deteriorated to a predetermined permissive deterioration value, an accumulated time until reaching to the deterioration value is output as a lifetime of the transistor in said first step.

Also preferably, a step of selecting only a transistor having a larger total deterioration amount than a predetermined set value from a plurality of transistors based on total deterioration amounts of the respective transistors obtained in said first step, and performing a characteristics simulation again on the transistor is furthermore included.

Furthermore preferably, a step of creating a deterioration amount table of transistors from deterioration amounts of a plurality of transistors obtained in said first step; and a step of referring to said deterioration amount table and obtaining a deterioration amount for each of a plurality of basic circuits each composed of a MIS transistor are furthermore included.

Also preferably, a step of successively calculating characteristics deterioration and characteristics recovery of each transistor for a series of plurality of gate voltage conditions of said respective transistors and operation temperature conditions of a plurality of transistors is furthermore included.

Preferably, a step of calculating said recovery amount by setting a new gate voltage when characteristics of said transistor is recovered to a predetermined value is furthermore included.

According to a second aspect of the present invention, there is provided a simulation method for simulating characteristics of a circuit when applying a negative bias voltage and a bias free voltage to a semiconductor circuit device comprising a MIS transistor, including a condition input step for inputting a use condition of said semiconductor circuit device; a step of simulating a circuit before deterioration for performing a simulation of an operation of a transistor in said semiconductor circuit device based on said input use condition and calculating an effective gate voltage of said transistor; a deterioration amount simulation step for calculating a deterioration amount ($\Delta P_D$) and a recovery amount ($\Delta P_R$) of characteristics of said transistor, calculating a lifetime of said transistor and calculating a total deterioration amount (P); a step of calculating characteristics-of said transistor after deterioration and simulating an operation of said semiconductor circuit device; and a step of outputting results of said simulation.

According to a third and fourth aspects of the present invention, there is provided a simulator for implementing the simulation methods of the above first and second aspects.

In the semiconductor characteristics simulation method of the present invention, a basic deterioration amount $X_D$, a deterioration change amount $\Delta P_D$, a characteristics recovery amount $\Delta P_R$, and a total deterioration amount P are obtained. Based on these, a simulation is performed for characteristics changes by taking into account changes (an increase) of deterioration with respect to the basic deterioration amount $X_D$ and recovery of characteristics (a decrease of deterioration with respect to the basic deterioration amount $X_D$). Based thereon, a deterioration amount of transistor characteristics depending on a time passed after first application of a voltage in a measurement step or a burn-in step, etc. after forming the transistor or a time passed after being put into use is obtained.

BRIEF DESCRIPTION OF DRAWINGS

FIG. 3A and FIG. 3B are views showing a gate voltage dependency of a transistor characteristics recovery amount.

BEST MODE FOR CARRYING OUT THE INVENTION

Preferred embodiments of a semiconductor characteristics simulation method and a semiconductor characteristics simulation apparatus of the present invention will be explained with reference to the attached drawings.

First Embodiment

The present inventors perceived details of the NBTI (Negative Bias Temperature Instability) deterioration phenomenon of a MIS transistor, particularly, a characteristics deterioration phenomenon of a transistor and a recovery phenomenon of a transistor characteristics after characteristics deterioration by experimental data and, based on the experimental data, found an empiric formula expressing the deterioration phenomenon and recovery phenomenon for simulating the NBTI deterioration phenomenon.

Figure 1A:
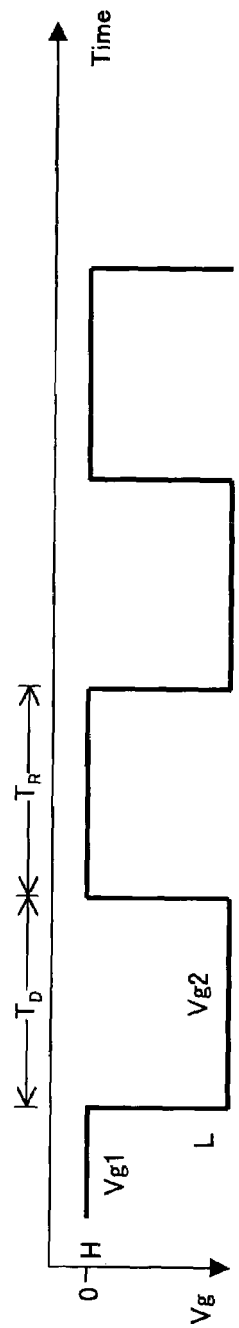
FIG. 1A and FIG. 1B are views showing deterioration and recovery of transistor characteristics and their dependency on a gate voltage as a first embodiment of the present invention.
Figure 1B:
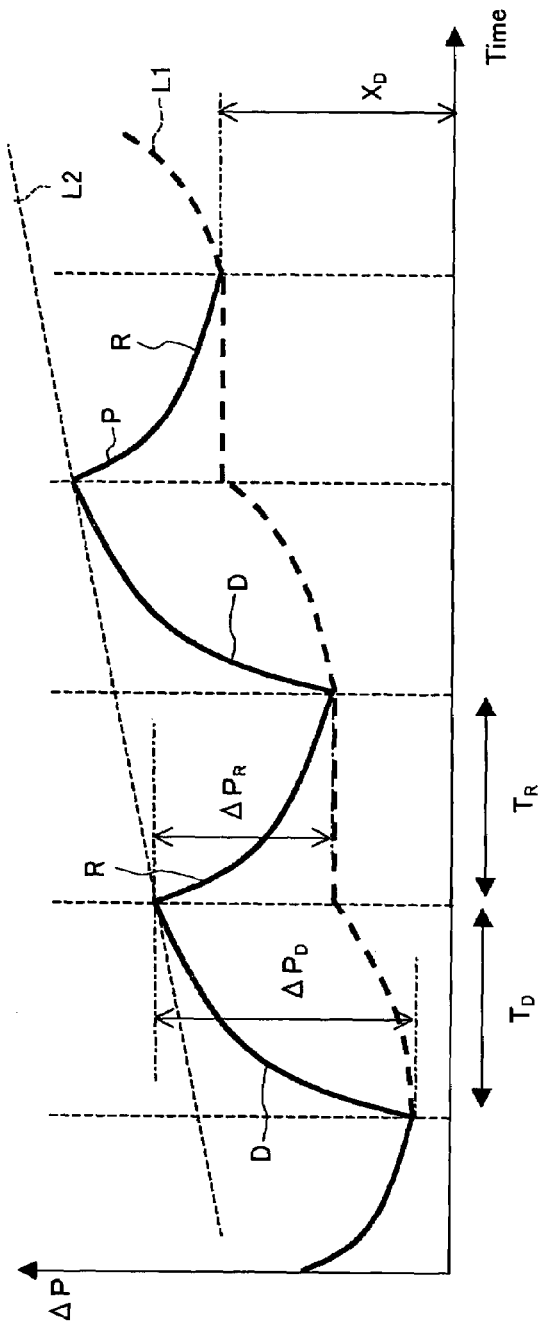

FIG. 1A and FIG. 1B schematically show changes of transistor characteristics, such as a driving ability and a threshold voltage, over time as the NBTI deterioration phenomenon, and shows an example where the transistor characteristics deteriorate over time due to a gate voltage applied to a gate of the transistor. FIG. 1A shows changes of a pulse waveform of a gate voltage "Vg" over time, and in FIG. 1B, the ordinate axis indicates a total deterioration amount $\Delta P$ of any characteristics amount and the abscissa axis indicates the passage of time.

As shown in FIG. 1A and FIG. 1B, when a gate voltage "Vg" (a second gate voltage "Vg2") of a negative level is applied as a negative bias voltage to the transistor in a period $T_D$, the deterioration characteristics of the transistor rises as a curve D (a deterioration characteristics proceeds). On the other hand, when terminating the application of the gate voltage "Vg2" as a negative bias voltage to the transistor in the period $T_R$ or applying a first gate voltage "Vg1", for example Vg1=0, as a bias free voltage having a higher level than that of the second gate voltage "Vg2", the deterioration characteristics of the transistor decline as a curve R (deterioration characteristics recover).

When applying a pulse gate voltage "Vg" alternately changing to the first gate voltage "Vg1" as a bias free voltage and to the second gate voltage "Vg2" of a negative level as a negative bias voltage to the gate of the transistor periodically or non-periodically as shown in FIG. 1A, deterioration progress and deterioration recovery repeat, but the total deterioration amount P increases over time.

In respective period $T_D$ of applying the gate voltage "Vg" (Vg2) of a negative level to the gate of the transistor, a curve L1 connecting the minimum values of deterioration or the maximum values (the lowest points) of recovery is also called a direct current portion of a deterioration amount which does not take into account changes of transistor characteristics, that is, deterioration and recovery of the transistor. Below, the deterioration amount of the direct current portion is called a "basic deterioration amount" $X_D$.

Conventionally, changes of characteristics deterioration of a transistor gave consideration only to the basic deterioration amount $X_D$ but not to the characteristics recovery. Therefore, it was different from actual characteristics deterioration. In the present invention, the characteristics recovery is also considered.

In FIG. 1B, the period where deterioration of transistor characteristics arises in accordance with the gate voltage (second gate voltage) "Vg2" of a negative level (L) applied to the transistor, that is, a time zone $T_D$ wherein the curve D rises is called "a deterioration period". The period where the transistor characteristics recover in accordance with application of a gate voltage (the first gate voltage) "Vg1" of a high level (H) (for example, Vg=0) as a bias free voltage or termination of application of the second gate voltage "Vg2" of a negative level (L) as a negative bias voltage, that is, a time zone $T_R$ of the curve R is called "a recovery period".

Below, in the deterioration period $T_D$, a deterioration increase amount with respect to a basic deterioration amount $X_D$ will be called "a change amount of a deterioration amount" or simply "a deterioration amount" and written by a mark $\Delta P_D$. In the recovery period $T_R$, a deterioration decrease amount with respect to the basic deterioration amount $X_D$ is called "a recovery amount" and written by a mark $\Delta P_R$.

[Calculation of Deterioration Amount $\Delta P_D$]

In the embodiment of the present invention, the formula 2 below was obtained as a result that the present inventors analyzed the experimental measurement results. Namely, a logarithm "log(t)" of a time "t" passed after applying to the transistor a second gate voltage "Vg2" of a negative level (L) as a negative bias voltage was obtained to calculate the deterioration amount $\Delta P_D$ of the transistor.

$$\Delta P_D(t) = C_D + B_D \cdot \log(t) \quad (2)$$

Note that $C_D$ and $B_D$ are constants.

The "log(t)" can be substituted by a natural logarithm "ln(t)".

The deterioration amount $\Delta P_D$ is an amount of deterioration progressed in a deterioration period $T_D$ from the basic deterioration amount $X_D$ at a starting point in the deterioration period $T_D$ and indicates a deterioration amount or a deterioration rate from the initial characteristics. As the characteristics deterioration amount or the deterioration rate from the initial characteristics, for example, a deterioration amount, such as a threshold value "Vth" and "Swing", as a characteristics value of the transistor, and a deterioration rate, such as a mutual conductance "gm", a source/drain current "Ids", an off current "Ioff", a gate current "Ig" and "Swing", may be mentioned. Also, there is, for example, a deterioration rate or a deterioration amount of constants "Vth0", "u0" and "rdsw", etc. of a circuit simulator, such as a SPICE simulator.

Below, a method of obtaining constants $C_D$ and $B_D$ will be explained.

(1) When considering only a negative bias voltage:

As shown in FIG. 1A and FIG. 1B, changes of the deterioration amount $\Delta P_D$ over time depend on a duration of applying a gate voltage "Vg" as a negative bias voltage, that is, the second gate voltage "Vg2". Accordingly, the constants $C_D$ and $B_D$ are determined by the duration of applying the second gate voltage "Vg2" applied to the transistor.

As an embodiment of the present invention, a constant $C_D$ depending on duration of applying the gate voltage "Vg" (Vg2) is obtained by using the formula 3 or the formula 4 obtained based on experimental data.

$$C_D = C_{DV} e^{n_{CV}/V_g} \quad (3)$$

Note that "$C_{DV}$" and "$n_{cv}$" are constants obtained from experiments.

$$C_D = C_{DV} e^{\alpha_{CV} + \beta_{CV} \cdot V_g \cdot nn} \quad (4)$$

Note that "$C_{DV}$", "$\alpha_{cv}$" and "$\beta_{cv}$" are constants obtained from experiments.

Also, in the same way as the constant $C_D$, the constant $B_D$ depending on the duration of applying a gate voltage "Vg" as a negative bias voltage, that is, the second gate voltage "Vg2" is obtained by using the formula 5 or the formula 6.

$$B_D = B_{DV} e^{n_{BV}/V_g} \quad (5)$$

Note that "$B_{DV}$" and "$n_{Bv}$" are constants obtained from experiments.

$$B_D = B_{DV} e^{\alpha BV + \beta BV \cdot V_g} \quad (6)$$

Note that "BDV" "αBV" and "βBV" are constants obtained from experiments.

In actual, much of experimental data can be recreated when using the formulas 3 and 5, but a part of the experimental results matched better when using the formulas 4 and 6, so that it is preferable to use the both formulas accordingly.

(2) When considering a negative bias voltage and a bias free voltage:

The deterioration amount $\Delta P_D$ depends not only on the gate voltage "Vg" (Vg2) as a negative bias voltage currently applied to the transistor, but on a gate voltage "Vgp" immediately before applying the second gate voltage "Vg2", that is, a bias free voltage.

Figure 2A:
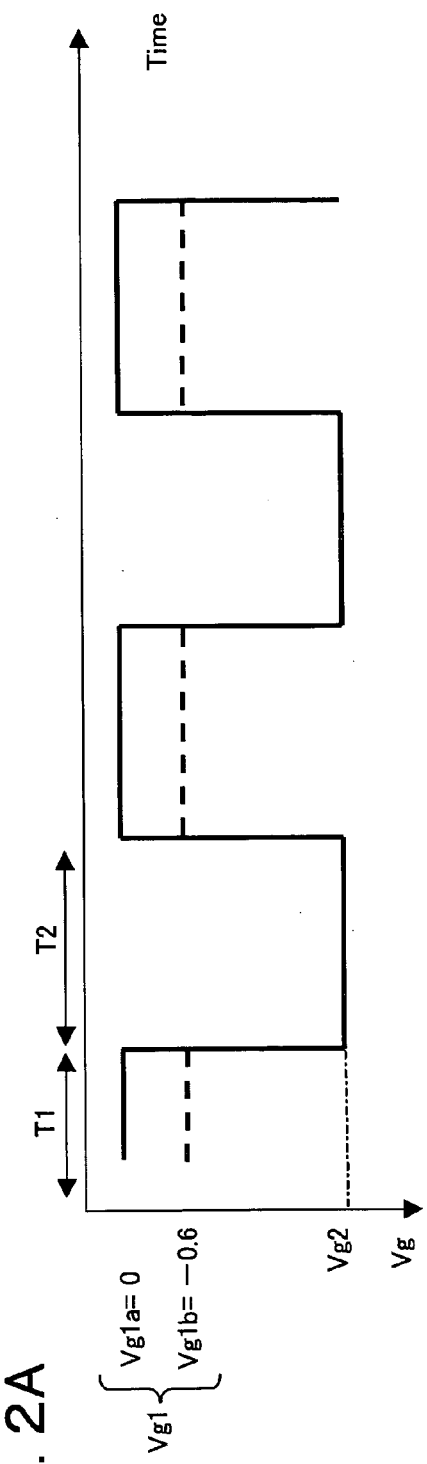
FIG. 2A and FIG. 2B are views showing gate voltage dependency of a transistor characteristics deterioration amount.
Figure 2B:
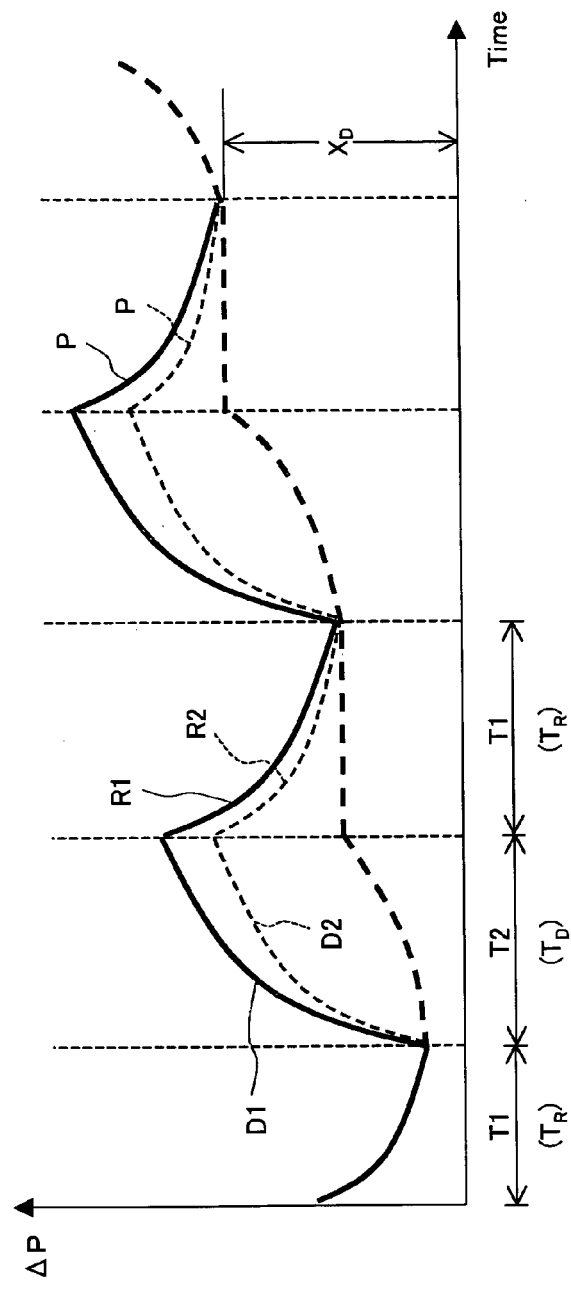

FIG. 2A and FIG. 2B show dependency of the deterioration amount $\Delta P_D$ on the gate voltage "Vgp" immediately before applying the second gate voltage "Vg2" of a negative level to a gate of the transistor. FIG. 2A shows changes of the gate voltage "Vg" applied to the transistor and, in FIG. 2B, the ordinate axis indicates a total deterioration amount "P" of any characteristics amount and the abscissa axis indicates time.

In FIG. 2A, it is assumed that, for example, two kinds of gate voltages, a high voltage "Vg1a" and a low voltage "Vg1b", are respectively applied to a gate electrode as a first gate voltage "Vg1" having a higher level than that of the second gate voltage "Vg2" of a negative level in the recovery period "T1". As an example, it is assumed Vg1a=0V and Vg1b=−0.6V.

As shown in FIG. 2B, in the deterioration period "T2", when a second gate voltage "Vg2" of a lower level than that of the voltage "Vg1b" is applied to the gate of the transistor, the transistor characteristics deteriorate. A deterioration amount of the transistor in the deterioration period "T2" wherein the second gate voltage "Vg2" is applied differs based on whether the first gate voltage "Vg1" applied to the transistor in the recovery period "T1" is a high voltage "Vg1a" or a low voltage "Vg1b". When a high voltage "Vg1a" is applied in the recovery period "T1", the transistor characteristics deteriorate along with the curve "D1". On the other hand, when a low voltage "Vg1b" is applied in the recovery period "T1", the transistor characteristics deteriorate along with the curve "D2". Namely, from the illustration of FIG. 2B, it is known that the larger a voltage difference $\Delta V(=Vg1-Vg2)$ between the second gate voltage "Vg2" in the deterioration period "T2" and the first gate voltage "Vg1" in the recovery period "T1", the larger the deterioration amount.

In the present embodiment, based on experimental data, the formulas 3 to 6 expressing dependency on the application duration by a gate voltage "Vg" currently applied in the period "T2" are added with components of the deterioration amount $\Delta P_D$ depending on height of a gate voltage "Vgp" (first gate voltage "Vg1") applied to the gate of the transistor immediately before applying the second gate voltage "Vg2" in the period "T1", and the formula 7 or formula 8 and the formula 9 or formula 10 are obtained.

$$C_D = C_{DV}\left(e^{\frac{n_{CV}}{Vg}} \pm C_{DVP}e^{\frac{n_{CVP}}{Vgp}}\right) \quad (7)$$

$$C_D = C_{DV}(e^{60\ CV+\beta_{CV}\cdot Vg} \pm C_{DVP}e^{\alpha_{CVP}+\beta_{CVP}\cdot Vgp}) \quad (8)$$

The "$C_{DV}$", "$n_{CV}$", "$C_{DVP}$", "$n_{cvp}$", "$\alpha_{cv}$", "$\beta_{cv}$", "$\alpha_{cvp}$" and "$\beta_{cvp}$" are constants respectively obtained from experiments.

$$B_D = B_{DV}\left(e^{\frac{n_{BV}}{Vg}} \pm B_{DVP}e^{\frac{n_{BVP}}{Vgp}}\right) \quad (9)$$

$$B_D = B_{DV}(e^{60\ BV+\beta_{BV}\cdot Vg} \pm B_{DVP}e^{\alpha_{BVP}+\beta_{BVP}\cdot Vgp}) \quad (10)$$

The "$B_{DV}$", "$n_{Bv}$", "$B_{DVP}$", "$n_{Bvp}$", "$\alpha_{Bv}$", "$\beta_{Bv}$", "$\alpha_{Bvp}$" and "$\beta_{Bvp}$" are constants respectively obtained from experiments.

The constants $C_D$ and $B_D$ applied to the formula 2 depend on the gate voltage "Vg" applied in the deterioration period "$T_D$", that is, the second gate voltage "Vg2" and the gate voltage "Vgp" applied in the recovery period "$T_{Rr}$", that is, the first gate voltage "Vg1".

(3) When considering temperature dependency:

The deterioration amount $\Delta P_D$ depends also on a temperature of the transistor in operation.

As the temperature dependency of the deterioration amount $\Delta P_D$, a relationship of the constants $C_{DV}$ and $B_{DV}$ in the formulas 7 to 10 and an absolute temperature T are shown in formulas 11 and 12 below.

$$C_{DV}=C_{DVT}\cdot e^{Q_{DC}/k\cdot(1/T0-1/T)} \quad (11)$$

$$B_{DV}=B_{DVT}\cdot e^{Q_{DB}/k\cdot(1/T0-1/T)} \quad (12)$$

The "$C_{DVT}$", "$Q_{DC}$", "$B_{DVT}$" and "$Q_{DB}$" are constants respectively obtained from experiments, "T" is an absolute operation temperature of the transistor in experiments, and "T0" is a reference absolute operation temperature of the transistor. The "k" is the Boltzmann constant.

When applying the formulas 11 and 12 to the formulas 5 and 7 or the formulas 6 and 8, constants $C_D$ and $B_D$ considering temperature dependency are obtained, and when applying the thus obtained constants $C_D$ and $B_D$ to the formula 2, a deterioration amount $\Delta P$ considering the temperature dependency can be calculated. As a result, an accurate deterioration amount $\Delta P$ can be calculated.

[Calculation of Recovery Amount $\Delta P_R$]

The present inventors perceived details of a recovery state of characteristics after deterioration in the NBTI deterioration phenomenon by experimental data based on the experimental measurement result and found an empiric formula expressing the recovery based on the experimental data. The empiric formula is shown as the formula 13 below.

$$\Delta P_R(t)=C_R+B_R\cdot\log(t) \quad (13)$$

Note that $C_R$ and $B_R$ are constants.

The "log(t)" can be substituted by a natural logarithm "ln(t)".

In the present embodiment, as shown in the formula 13, a recovery amount $\Delta P_R$ is calculated by using a logarithm "log(t)" in time "t" passed after applying a voltage of a gate voltage "Vg" ("Vg1" in FIG. 2A) in the recovery period "T1". Namely, the recovery amount $\Delta P_R$ is calculated by using a time "t" passed from a start of the recover in the period "T1" after deteriorating in the period "T2".

(1) Dependency on Maximum Gate Voltage

Changes of the recovery amount $\Delta P_R$ over time depend on height of the gate voltage "Vg". Furthermore, the recovery amount $\Delta P_R$ depends on the maximum gate voltage "Vgm" applied in the past as a negative bias voltage in a deterioration period.

FIG. 3A and FIG. 3B show dependency on the maximum gate voltage "Vgm" by the recovery amount $\Delta P_R$. FIG. 3A and FIG. 3B show deterioration of a MIS transistor characteristics due to the gate voltage, wherein FIG. 3A shows the gate voltage "Vg" and, in FIG. 3B, the ordinate axis indicates a total deterioration amount $\Delta P$ of any characteristics amount and the abscissa axis indicates a logarithm of time.

In FIG. 3A, the gate of the transistor is applied with, for example, the maximum gate voltage "Vgm" of a negative level having the maximum amplitude and a gate voltage "Vgx" of a high level having a lower absolute value (amplitude) than that of the maximum gate voltage "Vgm", respectively. As shown in FIG. 3B, when the maximum gate voltage "Vgm" or the gate voltage "Vgx" is applied to the transistor in the deterioration period $T_D$, the transistor deteriorates and, then, transistor characteristics recover respectively along the lines R3 and R4 in the recovery period $T_R$. From the experimental results, inclinations of the lines R3 and R4 expressing changes of the recovery amount over time depend mainly on the maximum gate voltage "Vgm" applied in the past. Namely, in FIG. 3B, inclinations of R3 and R4 depend on the maximum gate voltage "Vgm" and are substantially the same.

In the present embodiment, a constant $C_R$ depending on the maximum gate voltage "Vgm" is obtained by using the formulas 14 or formula 15 obtained based on experimental data.

Also, by using the formula 16 or formula 17, a constant $B_R$ depending on the maximum gate voltage "Vgm" is obtained.

$$C_R = C_{RVM} e^{nCRVM/Vgm} \quad (14)$$

$$C_R = C_{RVM} e^{\alpha CRVM + \beta CRVM \cdot Vgm} \quad (15)$$

$$B_R = B_{RVM} e^{nRBVM/Vgm} \quad (16)$$

$$B_R = B_{RVM} e^{\alpha BRVM + \beta BRVM \cdot Vgm} \quad (17)$$

The "$C_{RVM}$", "$n_{BRVM}$", "$\alpha_{CRVM}$" and "$\beta_{BRVM}$" are constants obtained from experiments.

The "$B_{RVM}$", "$n_{BRVM}$", "$\alpha_{BRVM}$" and "$\beta_{BRVM}$" are constants obtained from experiments.

As same as the calculation of the deterioration amount $\Delta P_D$, actually, the recovery amount $\Delta P_R$ also recreated much of experimental data when using the formula 14 and the formula 16, but a part of the experimental results was matched better with the formulas 15 and 17, SO that the both formulas are shown.

(2) Dependency on Maximum Gate Voltage and Current Application Gate Voltage

The recovery amount $\Delta P_R$ depends not only on the maximum gate voltage "Vgm" applied to the gate of the transistor in the past, but also on the currently applied gate voltage "Vg".

As to constants $C_R$ and $B_R$ regulating the recovery amount $\Delta P_R$ obtained based on experimental data, formulas obtained by adding dependency of the gate voltage "Vg" (bias free voltage) currently applied in a recovery period to the formulas 14 to 17 expressing dependency of the maximum gate voltage "Vgm" applied in the past are the formulas 18 and 19 or formulas 20 and 21.

$$C_R = C_{RVM} \left( e^{\frac{n_{CRVM}}{Vgm}} \pm C_{RV} e^{\frac{n_{CRV}}{Vg}} \right) \quad (18)$$

$$C_R = C_{RVM} (e^{\alpha CRVM + \beta CRVM \cdot Vgm} \pm C_{RV} e^{\alpha CRV + \beta CRV \cdot Vg}) \quad (19)$$

$$B_R = B_{RVM} \left( e^{\frac{n_{RBVM}}{Vgm}} \pm B_{RV} e^{\frac{n_{BRV}}{Vg}} \right) \quad (20)$$

$$B_R = B_{RVM} (e^{\alpha BRVM + \beta BRVM \cdot Vgm} \pm B_{RVP} e^{\alpha BRV + \beta BRV \cdot Vg}) \quad (21)$$

The "$C_{RVM}$", "$n_{CRVM}$", "$\alpha_{CRVM}$", "$\beta_{CRVM}$", "$\alpha_{CRV}$" and "$\beta_{CRV}$" are constants obtained from experiments.

The "$B_{RVM}$", "$n_{BRVM}$", "$\alpha_{BRVM}$", "$\beta_{BRVM}$", "$\alpha_{BRV}$" and "$\beta_{BRV}$" are constants obtained from experiments.

Based on the formulas 18 to 21, constants $C_R$ and $B_R$ are calculated from the maximum gate voltage "Vgm" of a negative level having a higher absolute value applied before recovery of the transistor characteristics (t<0) and the gate voltage "Vg" (bias free voltage) currently applied in the recovery period, and the results are applied, for example, to the formula 13 to calculate the recovery amount $\Delta P_R$.

(3) Temperature Dependency

The recovery amount $\Delta P_R$ depends also on a temperature of the transistor in operation.

As the temperature dependency of the recovery amount $\Delta P_R$, a relationship of constants $C_{RVM}$ and $B_{RVM}$ in the formulas 18 to 21 (or formulas 14 to 17) and an absolute temperature "T" is expressed by the formulas 22 and 23.

$$C_{RVM} = C_{RVMT} \cdot e^{QRC/k \cdot (1/T0 - 1/T)} \quad (22)$$

$$B_{RVM} = B_{RVMT} \cdot e^{QRC/k \cdot (1/T0 - 1/T)} \quad (23)$$

The "$C_{RVMT}$", "$Q_{RC}$", "$\beta_{RVMT}$" and "$Q_{RB}$" are constants obtained from experiments, etc., "T" is an absolute temperature of the transistor under experiment, and "T0" is a reference temperature.

[Calculation of Total Deterioration Amount "P"]

The total deterioration amount "P" arisen in a deterioration period "$T_D$" is, as shown in the formula 24, a sum of a basic deterioration amount $X_D(t)$ and a deterioration amount $\Delta P_D(t)$.

$$P = \Delta P_D(t) + X_D(t) \quad (24)$$

The total deterioration amount "P" arisen in the recovery period "$T_R$" is a value obtained by subtracting the recovery amount $\Delta P_R(t)$ from the sum of the basic deterioration amount $X_D(t)$ and the deterioration amount $\Delta P_D(t)$ in the deterioration period immediately before applying a gate voltage to the gate of the transistor as shown in the formula 25.

$$P = \Delta P_D(t) - \Delta P_R(t) + X_D(t) \quad (25)$$

The formulas 26 to 29 below are calculation formulas of the basic deterioration amount $X_D(t)$ in the NBTI deterioration phenomenon.

Namely, the formulas 26 to 29 below successively calculates a total accumulated time of a deterioration period for applying the second gate voltage "Vg2" (negative bias voltage) of a negative level (L) as a first time "time1" and a total accumulated time for applying the first gate voltage "Vg1" (bias free voltage) as a second time "time2".

$$X_D(t) = C \cdot e^{Q/k \cdot (1/T0 - 1/T)} \cdot (e^{\gamma/Vg1} \cdot \text{time1} + e^{\gamma/Vg2} \cdot \text{time2})^n \quad (26)$$

$$X_D(t) = C \cdot e^{Q/k \cdot (1/T0 - 1/T)} \cdot (e^{\alpha + \beta \cdot Vg1} \cdot \text{time1} + e^{\alpha + \beta \cdot Vg2} \cdot \text{time2})^n \quad (27)$$

$$X_D(t) = C \cdot e^{\frac{Q}{k} \cdot \left(\frac{1}{T0} - \frac{1}{T}\right)} \cdot \left( \sum_i (e^{\gamma/Vgi} \cdot \text{timei}) \right)^n \quad (28)$$

$$X_D(t) = C \cdot e^{\frac{Q}{k} \cdot \left(\frac{1}{T0} - \frac{1}{T}\right)} \cdot \left( \sum_i (e^{\alpha + \beta \cdot Vgi} \cdot \text{timei}) \right)^n \quad (29)$$

The mark "t" is a time passed after applying the gate voltage "Vg1" or "Vg2". The "C", "$\alpha$", "$\beta$", "$\gamma$", "n" and "Q" are constants obtained by experiments, etc.

The formulas 26 and 27 express a basic deterioration amount $X_D(t)$, for example as shown in FIG. 1A, when applying a pulse gate voltage signal "Vg" composed of the second gate voltage "Vg2" of a negative level (L) and the first gate voltage "Vg1" of a high level (H).

The formulas 28 and 29 express a basic deterioration amount $X_D(t)$ of each passage of time "timei" (i=1, 2, 3, ... ) when applying any gate voltage "Vgi" (i=1, 2, 3, ... ) having a plurality of voltage values to the gate of the transistor. Namely, the formulas 26 and 27 are general formulas of the formulas 28 and 29.

In a transistor circuit simulation of the present embodiment which will be explained later on, standards are set for judging whether or not to execute calculation of a deterioration amount $\Delta P_D$ or whether or not to execute calculation of a recovery amount $\Delta P_R$.

For example, when the gate voltage "Vg" of a negative level reaches a level of a certain value or less, it is judged that changes of characteristics deterioration of the transistor starts, and a deterioration amount $\Delta P_D$ expressed by any one of the formula 2 and formulas 3 to 12 is calculated, furthermore, a total deterioration amount "P" expressed by the formula 24 is obtained by using the calculated deterioration amount $\Delta P_D$.

In the same way, when the gate voltage "Vg" reaches a certain value or more, it is judged that recovery of deterioration characteristics starts, and a recovery amount $\Delta P_R$ expressed by any one of the formula 13 and formulas 14 to 23 is calculated, furthermore, a total deterioration amount P expressed by the formula 25 is obtained by using the calculated recovery amount $\Delta P_R$.

According to the first embodiment of the present invention, by dealing with the phenomenon of deterioration and recovery of a transistor by applying a new NBTI method, simulation results close to actual deterioration amount and recovery amount can be obtained for transistor characteristics, and it is possible to give an optimal reliability deterioration margin at a high speed also in designing a semiconductor circuit with a further advanced transistor miniaturization (for example, the case where a designing rule is smaller than 180 nm).

As explained above, by simulating an accurate reliability deterioration margin, dimensions of a MIS transistor can be made small when a deterioration amount is decreased comparing with that in the prior art, so that a wafer occupying area of the product decreases, the number of semiconductor circuit device products able to be produced per one wafer increases as a result, and the production costs can be lowered. On the other hand, when the deterioration amount is increased comparing with that in the prior art, a highly reliable circuit wherein a countermeasure is taken in advance for fulfilling a lifetime of the semiconductor device.

Second Embodiment

In the first embodiment, a basic deterioration amount $X_D(t)$ was expressed by using the formulas 26 to 29 for a simple description, but the present inventors found to express an actual basic deterioration amount $X_D(t)$ by a plurality of different functions in a plurality of time zones and not by one function defined for one time zone as in the conventional way.

Figure 4:
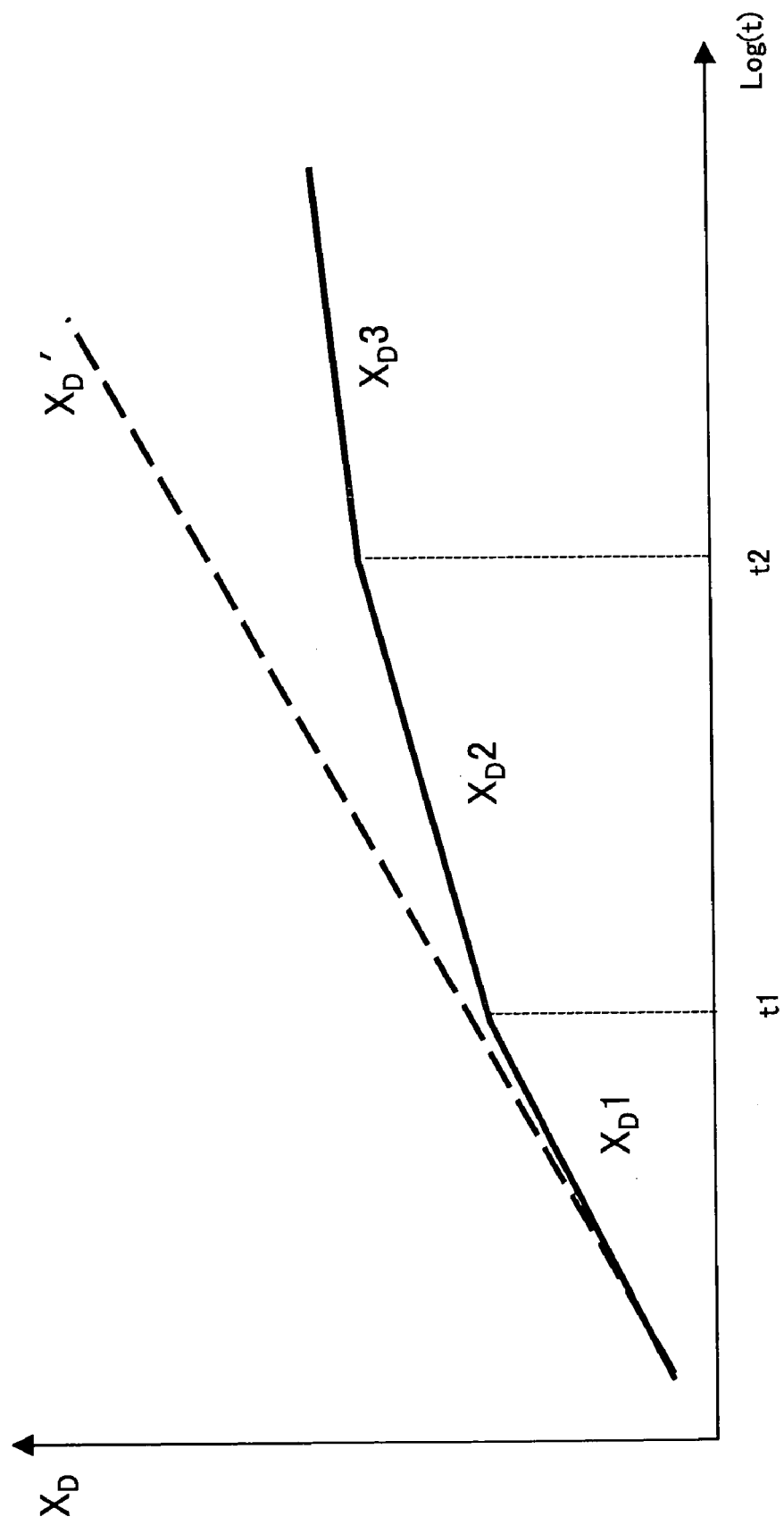
FIG. 4 is a view illustrating a method of calculating a basic deterioration amount of transistor characteristics by dividing into time zones as a second embodiment of the present invention.

FIG. 4 shows changes of a basic deterioration amount $X_D(t)$ over time wherein a conventional calculation method and a calculation method of the present invention are compared for illustration.

A dotted straight line indicates changes of a basic deterioration amount $X_D{'}$ over time by a conventional calculation formula, and a solid sequential line indicates a basic deterioration amount by embodiments of the present invention.

In the embodiments of the present invention, for example in three divided time zones (t<t1, t1<t<t2, t<t2), basic deterioration amounts $X_D1$, $X_D2$ and $X_D3$ in respective time zones are expressed by using different functions in the respective time zones. For example, the formulas 30 and 31 are used in the example shown in FIG. 4.

$$\text{time} = e^{\frac{Q}{k} \cdot (\frac{1}{T_0} - \frac{1}{T})} \cdot e^{\alpha} \cdot \sum_{j=1}^{lt} (e^{\beta \cdot (V_{gj} - V_{g0})} \cdot \Delta t_j) \quad (30)$$

$$P = C \cdot \sum_{k=1} [time^n]_{time=stime_k}^{time=etime_k} \quad (31)$$

In the formulas 30 and 31, the mark "Vg0" is a gate voltage to be a reference, "Vgj" is a gate voltage at a point "j", $\Delta tj$ is a time when the "Vgj" is applied, and "time" is a time of being converted to the "Vg0" and the reference absolute temperature "T0". The "lt" is a lifetime. The mark "j" is a subscript indicating a time zone, "stime-k" is a time when the zone "j" starts under the conditions of "Vg0" and "T0", and "etime-k" is a time when the zone "j" ends under the conditions of "Vg0" and "T0".

When obtaining a total deterioration amount "P" by using the formulas 30 and 31, for example, a deterioration amount $\Delta P_D$ or a recovery amount $\Delta P_R$ are calculated in advance, a time "time" passed so far is calculated by the formula 30, and the results are substituted in the formula 31 to obtain a basic deterioration amount $X_D$.

The total deterioration amount "P" is obtained by the formula 24 or formula 25.

The deterioration amount obtained by using the formula 30 and formula 31 was a value close to an actual transistor characteristics value. Namely, the deterioration amount accurately indicated an actual deterioration amount, and according to embodiments of the present invention, it became possible to improve the conventional method by which a deterioration amount being larger than the actual was estimated due to inaccuracy of the simulation.

According to the second embodiment of the present invention, by dealing with the phenomenon of deterioration and recovery of a transistor by applying the new NBTI method, simulation results close to actual deterioration amount and recovery amount can be obtained for transistor characteristics, and it is possible to give an optimal reliability deterioration margin at a high speed also in designing a semiconductor circuit with a further advanced transistor miniaturization (for example, the case where a designing rule is smaller than 180 nm).

Also, in the second embodiment of the present invention, as shown as an example in FIG. 4, by calculating a deterioration amount of each time zone by using different deterioration formula for each predetermined time zone, a deterioration amount of the transistor can be made close to an actual amount as a whole. According to the second embodiment of the present invention, as illustrated in FIG. 4, the deterioration amount could be made less than a value of a deterioration amount obtained by the conventional method.

According to the second embodiment of the present invention, a more accurate deterioration amount can be simulated by taking into account changes of transistor deterioration as a new NBTI deterioration phenomenon.

According to the second embodiment of the present invention, the deterioration amount increases comparing with that in the result of conventional simulation in many cases.

Also, according to the second embodiment of the present invention, a more accurate final deterioration amount can be simulated by taking into account the new NBTI recovery phenomenon.

According to the second embodiment of the present invention, the deterioration amount widely decreases comparing with that in the conventional method in many cases.

As explained above, by simulating an accurate reliability deterioration margin, it becomes possible to make dimensions of a MIS transistor smaller when the deterioration amount is less than that in the conventional technique, so that a wafer occupying area decreases in a product, the number of semiconductor circuit device products able to be produced per one wafer increases as a result, and the production costs can be lowered. When the deterioration amount is increased comparing with that in the prior art, it is possible to design a highly reliable circuit wherein a countermeasure is taken in advance for fulfilling a lifetime of the semiconductor device.

Third Embodiment

Next, as a third embodiment of the present invention, an embodiment of a semiconductor characteristics simulator for carrying out the above first embodiment will be explained.

The simulator of the third embodiment of the present invention successively performs processing of a plurality of stress conditions imposed on a transistor in a semiconductor production step and in use by a user and use conditions, simulates deterioration and recovery of characteristics of the transistor or a circuit including the transistor, and evaluates characteristics changes of the transistor or the circuit including the transistor for one circuit composed of a MIS transistor, etc.

A part or all of deterioration of transistor characteristics and a part or all of recovery of transistor characteristics, for example, deterioration and recovery of MIS transistor characteristics in a measurement step of the transistor characteristics of applying a voltage on the transistor in a semiconductor production steps, recovery of transistor characteristics due to a let-stand period after the measurement step, deterioration and recovery of transistor characteristics in a burn-in step as a production step for screening a initial failure by heating the transistor, recovery of transistor characteristics in a let-stand period after the burn-in step, deterioration and recovery of transistor characteristics arisen when applying a voltage to the transistor when used by a user and heating caused by an operation of the transistor, and recovery of transistor characteristics in a let-stand period after being used by a user, etc. are successively calculated. Consequently, a more accurate deterioration amount can be simulated. In many cases, a deterioration amount obtained by the above method according to the embodiments of the present invention is largely decreased comparing, for example, with a deterioration amount obtained by only considering the burn-in step as in the conventional way.

Figure 5:
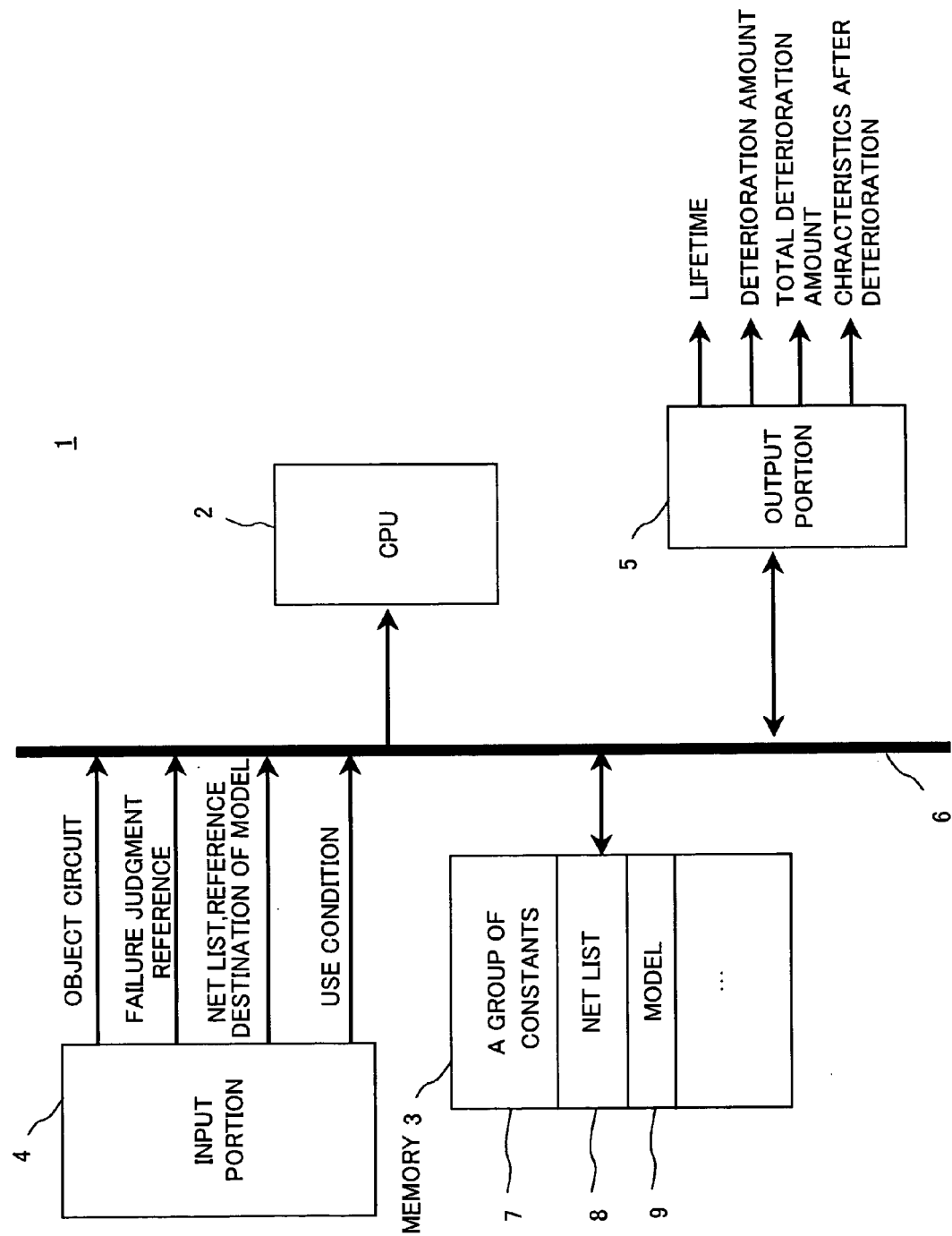
FIG. 5 is a view showing the configuration of a semiconductor device characteristics simulator according to a third embodiment of the present invention.

FIG. 5 is a view showing the configuration of the semiconductor characteristics simulator 1 according to the present embodiment.

The semiconductor characteristics simulator 1 is constituted by a computer system for calculating deterioration and recovery of transistor characteristics explained as the first embodiment and includes, for example, a processor (CPU) 2 for performing calculation and control, a memory 3 storing simulation models and necessary data for the models, an input portion 4 for receiving as an input data of necessary conditions for simulations, etc., an output portion 5 for outputting results of simulations, and a bus 6 for connecting between the processor 2, the memory 3, the input portion 4 and the output portion 5.

Note that the semiconductor characteristics simulator 1 may be configured to include a plurality of the above configurations wherein the respective semiconductor characteristics simulators 1 perform processing by distributing.

The memory 3 stores a group of constants 7 obtained by experiments, a net list 8 as data of connection relationships of object circuits subjected to simulations, and models 9 for performing simulations, etc., which are necessary for a simulation explained as the first embodiment.

From the input portion 4, a net list 7 of an object circuit subjected to a simulation and a reference destination of a simulation model 8 of the object circuit, for example a reference destination of a parameter of a SPICE circuit simulator of a transistor, are input to the processor 2.

Also, to successively perform processing on a plurality of use conditions of a circuit including the transistor and to accurately simulate deterioration and recovery of characteristics of the transistor or the circuit including the transistor, use conditions of the circuit and the transistor, such as an operation temperature, an application voltage and a time passed under the condition, are input from the input portion 4 to the processor 2 when simulating characteristics deterioration of the circuit and the transistor.

Also, to evaluate a deterioration amount obtained by the simulation, a deterioration permissive value as a failure judgment reference of the circuit and respective transistors after deterioration is input from the input portion 4 to the processor 2.

The processor 2 compares the deterioration amount obtained as a result of the simulation with the deterioration permissive value and optimizes the circuit after deterioration.

The output portion 5 outputs a lifetime of the transistor, a deterioration amount, a total deterioration amount and characteristics after deterioration obtained as a result of simulating in the processor 2.

Figure 6:
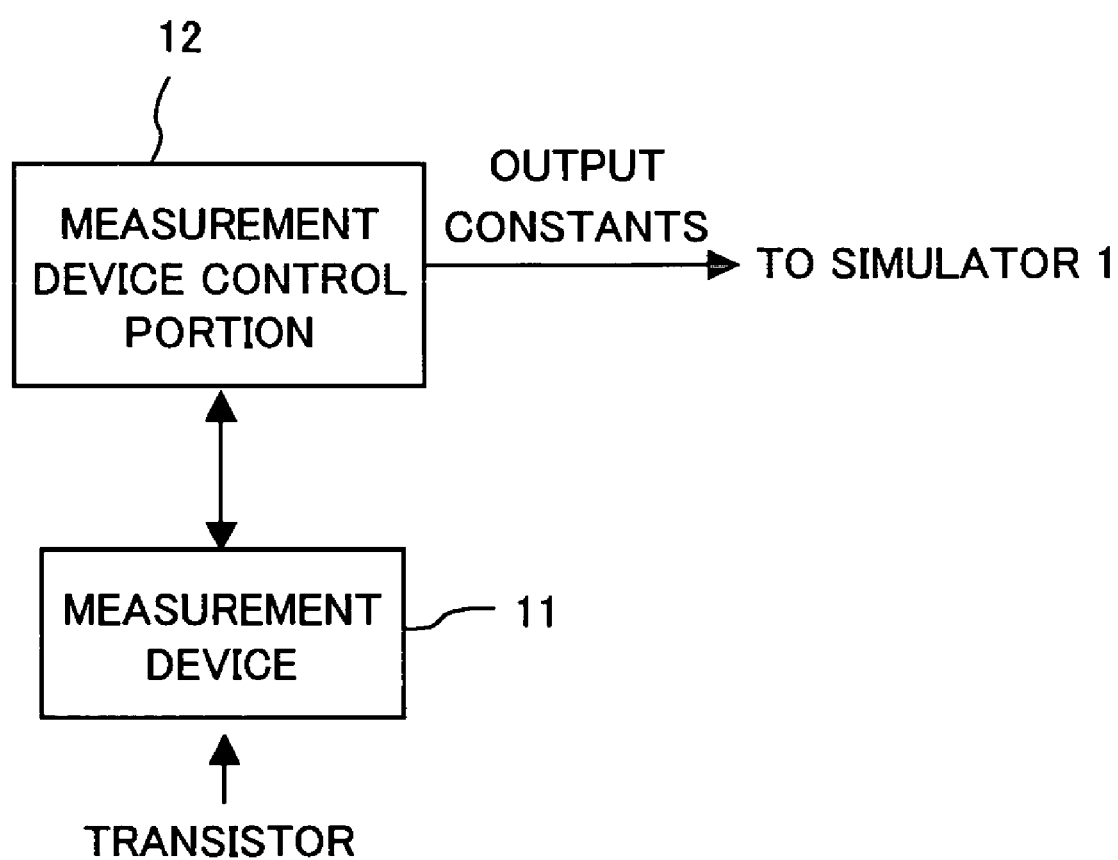
FIG. 6 is a view showing the configuration of a constant measurement device in the third embodiment of the present invention.

The group of constants 7 required for simulating a transistor or a circuit including the transistor by the semiconductor characteristics simulator 1 is measured by an apparatus having the configuration shown in FIG. 6. In FIG. 6, the transistor characteristics are measured by a measurement device 11 composed of a DC tester for measuring the transistor characteristics, for example, a source/drain current "Ids". A measurement device control portion 12 is composed, for example, of a computer and calculates the group of constants explained as the first embodiment from the measurement values on the transistor characteristics obtained by the measurement device 11, inputs to the simulator 1 and stores in the memory 3. Therefore, the measurement device control portion 12 controls the measurement device 11 to measure data on transistor characteristics and automatically executing calculation of constants based on the measurement results. The semiconductor characteristics simulator 1 uses the result to successively simulate deterioration of the transistor under a plurality of use conditions.

The measurement device 11 and the measurement device control portion 12, for example, measures constants used for simulating transistor characteristics for every gate length of the transistor, furthermore measures various data depending on a voltage between a source and drain of each transistor, outputs the results to the semiconductor characteristics simulator 1 and stores in the memory 3.

As explained above, by automating measurement of data required for the simulation by using the measurement device 11 and the measurement device control portion 12 and calculation of constants by using the measurement results, a large number of parameters can be obtained in a short time, deterioration and recovery of transistor characteristics can be calculated quickly (at a high speed) and the new NBTI deterioration phenomenon and recovery phenomenon can be accurately simulated.

With reference to flowcharts in FIG. 7 to FIG. 10, an operation of the semiconductor characteristics simulator 1 will be explained.

To explain overall processing of the simulation, the semiconductor device characteristics simulator 1 receives as an input the net list 7 of the object circuit subjected to the simulation and a reference destination of the simulation model 8, for example, a reference destination of a parameter of a SPICE circuit simulator of the transistor first. Then, the semiconductor characteristics simulator 1 activates the simulation model 8 and starts the simulation of deterioration of characteristics of the object circuit and characteristics of the transistor composing the same.

Figure 7:
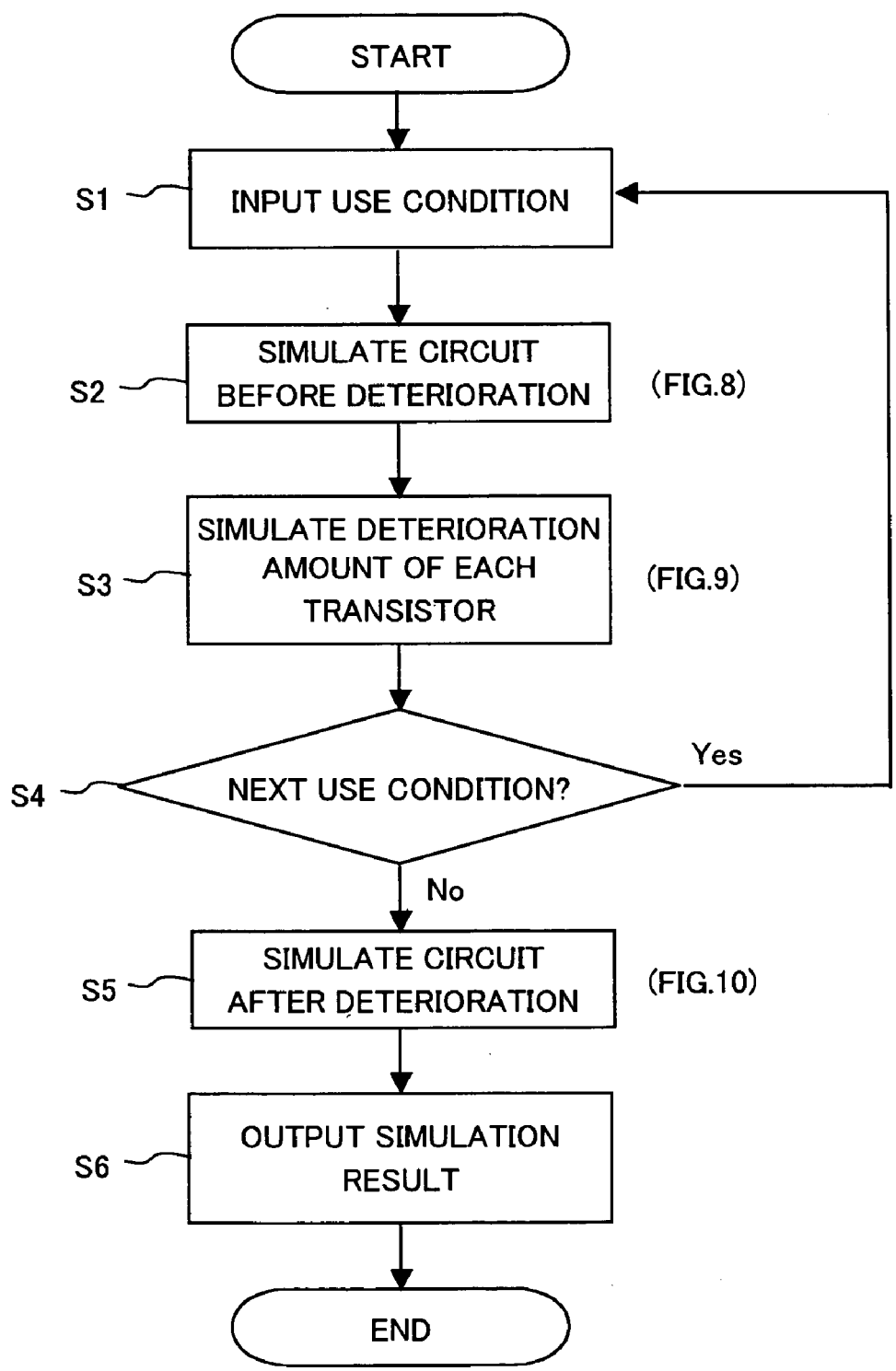
FIG. 7 is a flowchart showing a content of calculation processing of the semiconductor device characteristics simulator according to the third embodiment of the present invention.

FIG. 7 is a flowchart showing a calculation content of the semiconductor characteristics simulator 1.

Step S1: Inputting Use Condition of Simulation

A use condition of a transistor circuit as an object of the simulation, for example, a transistor operation temperature and other temperatures, a gate voltage and other voltages, and a passage of time when the transistor operates under the condition, etc. in a step of measuring characteristics of the transistor circuit is input to the processor 2 via the input portion 4 of the semiconductor characteristics simulator 1.

Step S2: Simulation of Circuit Before Deterioration

The processor 2 simulates circuit characteristics before deterioration of the transistor according to the model 9 for evaluating changes of characteristics of the transistor circuit due to deterioration, and stores the results to the memory 3. Details of the processing will be explained in detail with reference to FIG. 8.

Step S3: Simulation of Deterioration Amount of Each Transistor

The processor 2 calculates a deterioration amount, a recovery amount, a total deterioration amount and their dependency on a gate voltage and temperature until reaching to the use condition input from the input portion 4 and specified passage of time, for example, by a calculation method defined by the formulas 2 to 31 explained in the first embodiment according to the model 9 for each MIS transistor composing the object circuit. The processor 2 outputs from the output portion 5 an obtained lifetime and a deterioration amount of the transistor. Details of the processing will be explained in detail with reference to FIG. 9.

Step S4: Judgment of Next Use Condition

When furthermore continuing the simulation under other use condition, in the case where an operation by the user continues under a condition of, for example, in the left-stand period after the above characteristics measurement step, furthermore, a different temperature after the operation in the burn-in step, and a gate application voltage and other voltages, the processor 2 returns back to the step Si, receives as an input the next use condition from the input portion 4 and repeats simulation of circuit characteristics before deterioration (step S2) and simulations for each transistor (step S3) under the condition according to the model 9.

When no other use condition continues, the processor 2 proceeds to a step S5.

Step S5: Simulation of Circuit After Deterioration

To evaluate characteristics changes of the circuit due to deterioration, the processor 2 simulates circuit characteristics after deterioration based on a total deterioration amount obtained under a plurality of use conditions explained above according to the model 9. Details of the processing will be explained in detail with reference to FIG. 10.

Step S6: Output of Simulation Results

The processor 2 displays and compares the simulation result after deterioration with the circuit characteristics before deterioration stored in the memory 3 and evaluates characteristics changes of the circuit due to deterioration.

Also, the processor 2 creates, for example, a deterioration amount library from the deterioration amounts of the respective transistors under respective conditions obtained by the above simulations according to the model 9 and stores in the memory 3, so that they can be used for characteristics deterioration simulations of other circuits composed of the same transistor.

The processor 2 also calculates an increase of a delay time of the circuit due to characteristics deterioration according to the model 9 based on the simulation result after deterioration, creates a library of delay amounts of respective circuits and stores the same in the memory 3, so that they can be used for characteristics deterioration simulations of other circuits.

Figure 8:
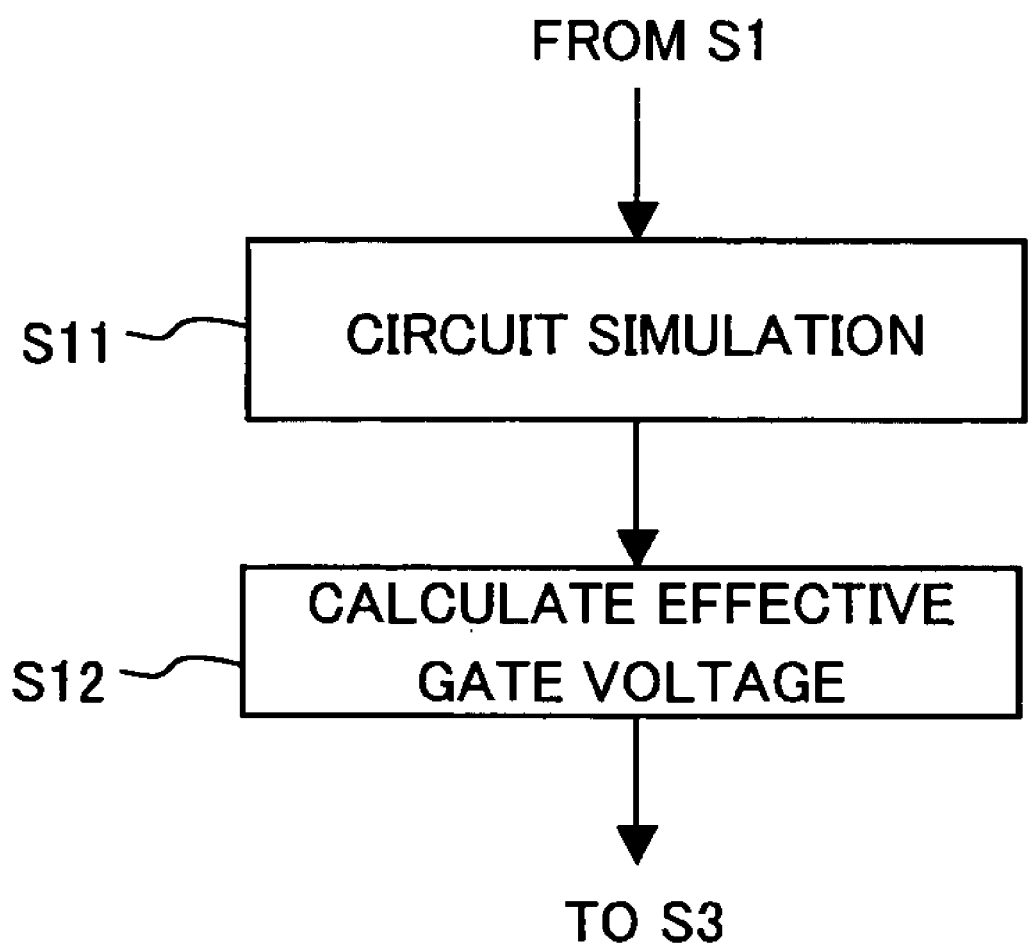
FIG. 8 is a flowchart showing details of processing in a step 2 illustrated in FIG. 7.

FIG. 8 shows a content of circuit characteristics simulation before deterioration in the step S2 illustrated in FIG. 7.

Step S11: Circuit Simulation

The processor 2 uses, for example, a circuit simulator, a SPICE and other circuit simulators as a part of the model 9 stored in the memory 3 to perform simulations and extracts circuit characteristics before deterioration.

The simulation result is indicated as changes over time, for example, on a gate voltage and a source/drain voltage.

Step S12: Calculation of Effective Gate Voltage

The processor 2 calculates an effective gate voltage for each MIS transistor from the simulation results obtained by the above method according to the model 9, and proceeds to the step S3 in FIG. 7.

Calculation of an effective gate voltage in the processor 2 is executed by using a group of constants 7 calculated by the measurement device 11 and stored in the memory 3.

Figure 9:
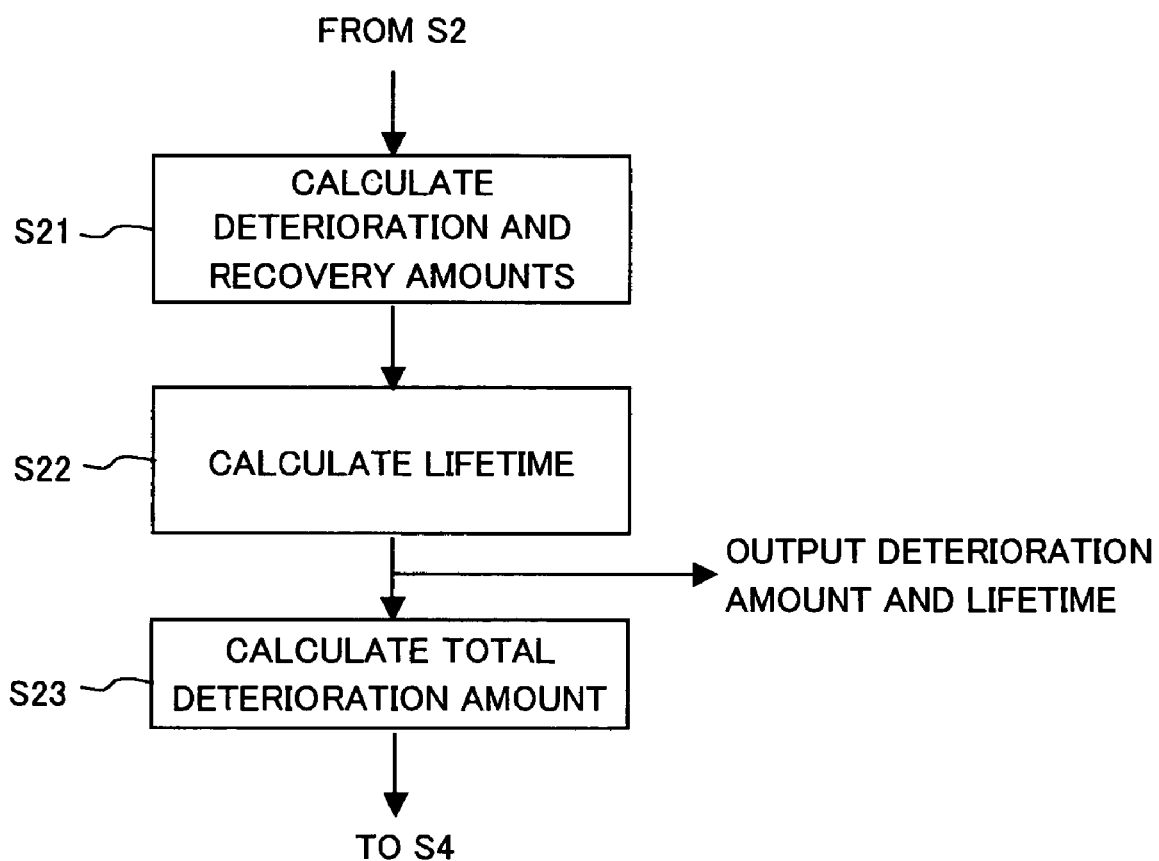
FIG. 9 is a flowchart showing details of processing in a step 3 illustrated in FIG. 7.

FIG. 9 shows a deterioration simulation method of each transistor in the step S3 illustrated in FIG. 7.

Step S21: Calculation of Deterioration and Recovery Amounts

For each MIS transistor, the processor 2 uses, for example, the formulas 2 to 31 to calculate a deterioration amount and a recovery amount of the transistor and their dependency on a voltage and temperature until reaching to a use condition input from the input portion 4 and a specified passage of time.

Step S22: Calculation of Lifetime

The processor 2 uses a deterioration permissive value to be a reference of failure judgment input for each MIS transistor according to the model 9 and calculates a lifetime of the transistor until an instantaneous total deterioration amount reaches the deterioration permissive value.

The calculation of a deterioration amount and a recovery amount and calculation of the lifetime in the processor 2 are measured by the measurement device 11 and executed by using the group of constants 7 calculated by the measurement device control portion 12 and stored in the memory 3.

The processor 2 outputs the calculated deterioration amount and the lifetime from the output portion 5.

Step S23: Calculation of Total Deterioration Amount

The processor 2 calculates a total deterioration amount of each MIS transistor from deterioration amounts calculated in the past for all use conditions input from the input portion 4 and proceeds to the step S4 in FIG. 7.

The processor 2 checks the maximum value of the calculated deterioration amount $\Delta P_D$ or the minimum value of the recovery amount $\Delta P_R$, for example, under the current use condition. Namely, the processor 2 calculates a time "time" from the results calculated by taking consideration on all of use conditions in the past and at present by using the formula 30, and regards a value obtained by substituting in the formula 31 as a basic deterioration amount $X_D$.

A total deterioration amount P up until then is obtained from the formula 24 and formula 25.

Figure 10:
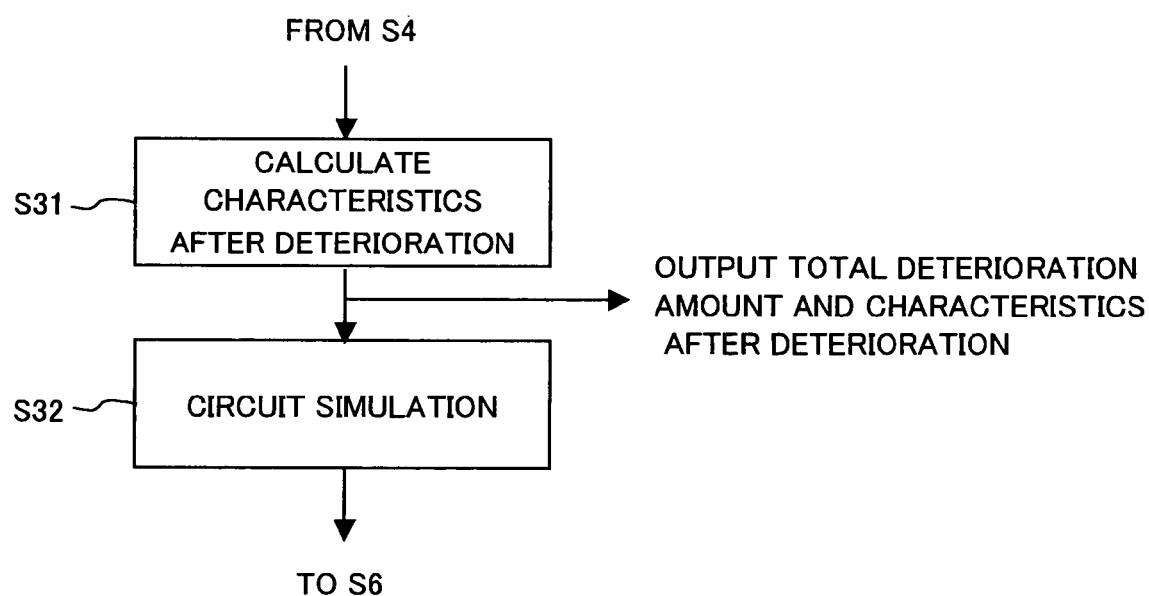
FIG. 10 is a flowchart showing details of processing in a step 5 illustrated in FIG. 7.

FIG. 10 shows a simulation of circuit characteristics after deterioration in the step S5 illustrated in FIG. 7.

Step S31: Calculation of Characteristics After Deterioration

The processor 2 calculates model parameters after deterioration of the MIS transistor, such as "Vth0", "u0" and "rdsw" after deterioration in the SPICE, from the total deterioration amounts calculated under the respective conditions up until then, and outputs the calculated results from the output portion 5.

Step S32: Circuit Simulation

The processor 2 performs a simulation on a circuit, such as a SPICE, by using the calculated model parameter and calculates circuit characteristics after deterioration.

As explained above, deterioration characteristics and recovery characteristics of the transistor generated under a plurality of use conditions are successively simulated on one circuit composed of a MIS transistor, etc. by the semiconductor characteristics simulator 1, and characteristics changes of circuit are evaluated.

Note that in use conditions of an actual transistor circuit, being different from a periodic stress imposing state, such as application of a gate voltage to the transistor explained as an example during operations of the transistor, a non-periodic left-stand period after processing as explained above, such as a left-stand period after measuring transistor characteristics in a semiconductor production step, a left-stand period after the burn-in step, and a left-stand period after turning the power off from on after being used by the user, exists many as a non-periodic period.

In such a non-periodic left-stand period, characteristics of the transistor and the circuit continue to recover to be able to recover to a condition close to a complete condition with no deterioration in some cases.

The simulator of the present embodiment detects that the characteristics are sufficiently recovered after sufficient recovery of transistor characteristics and reflects the same to calculation of the total deterioration amount. For example, the processor 2 judges that the total deterioration amount "P" calculated by the formulas 30 and 31 is recovered to a certain value and, in that case, parameters or a part of parameters necessary for calculation of deterioration and recovery are set again. For example, at this time, a dependency relationship of the recovery amount and the maximum gate voltage "Vgm" disappears, so that a value of the maximum gate voltage "Vgm" is reset when calculating the recovery amount.

According to the third embodiment of the present invention, by dealing with a phenomenon of deterioration and recovery of the new NBTI, accurate values close to the actual ones can be obtained for deterioration and/or recovery amounts of characteristics of a circuit including the transistor, so that it is possible to give an optimal reliability deterioration margin at a high speed also in designing a semiconductor circuit with a further advanced transistor miniaturization (for example, the case where a designing rule is smaller than 180 nm).

In the present embodiment, by considering a plurality of use conditions, such as actual semiconductor producing steps and use by a user, more accurate deterioration amount can be simulated. A deterioration amount obtained by the embodiments of the present invention by such a method is normally widely decreased comparing with a deterioration amount obtained by considering only one step in the conventional way.

According to the embodiment of the present invention, by automating calculation of constants required for the simulation and measurement of experimental data by using the measurement device 11 and the measurement device control portion 12, a large number of parameters required by the simulation can be obtained in a short time, furthermore, the results are input to the semiconductor characteristics simulator 1, where deterioration and recovery can be calculated at a high speed, and a deterioration phenomenon and a recovery phenomenon of the new NBTI can be accurately perceived.

Fourth Embodiment

Other embodiments of the semiconductor characteristics simulator according to the present invention will be explained.

A simulator of the fourth embodiment of the present invention can be suitably used for a simulation of characteristics deterioration of a very-large-scale integrated circuit (VLSI).

When simulating characteristics of a very-large-scale integrated circuit, since the configuration of the circuit is large and complicated, it takes a very long time to perform simulations of deterioration and recovery on all transistors with one semiconductor characteristics simulator. Therefore, a deterioration amount library of a transistor or a basic circuit is created in advance from the results obtained by deterioration simulations on the transistor or the basic circuit. Then, when performing a deterioration simulation of an objected circuit, a deterioration amount of the transistor and a basic circuit including the transistor in the objected circuit can be obtained quickly by using the deterioration amount library.

Figure 11:
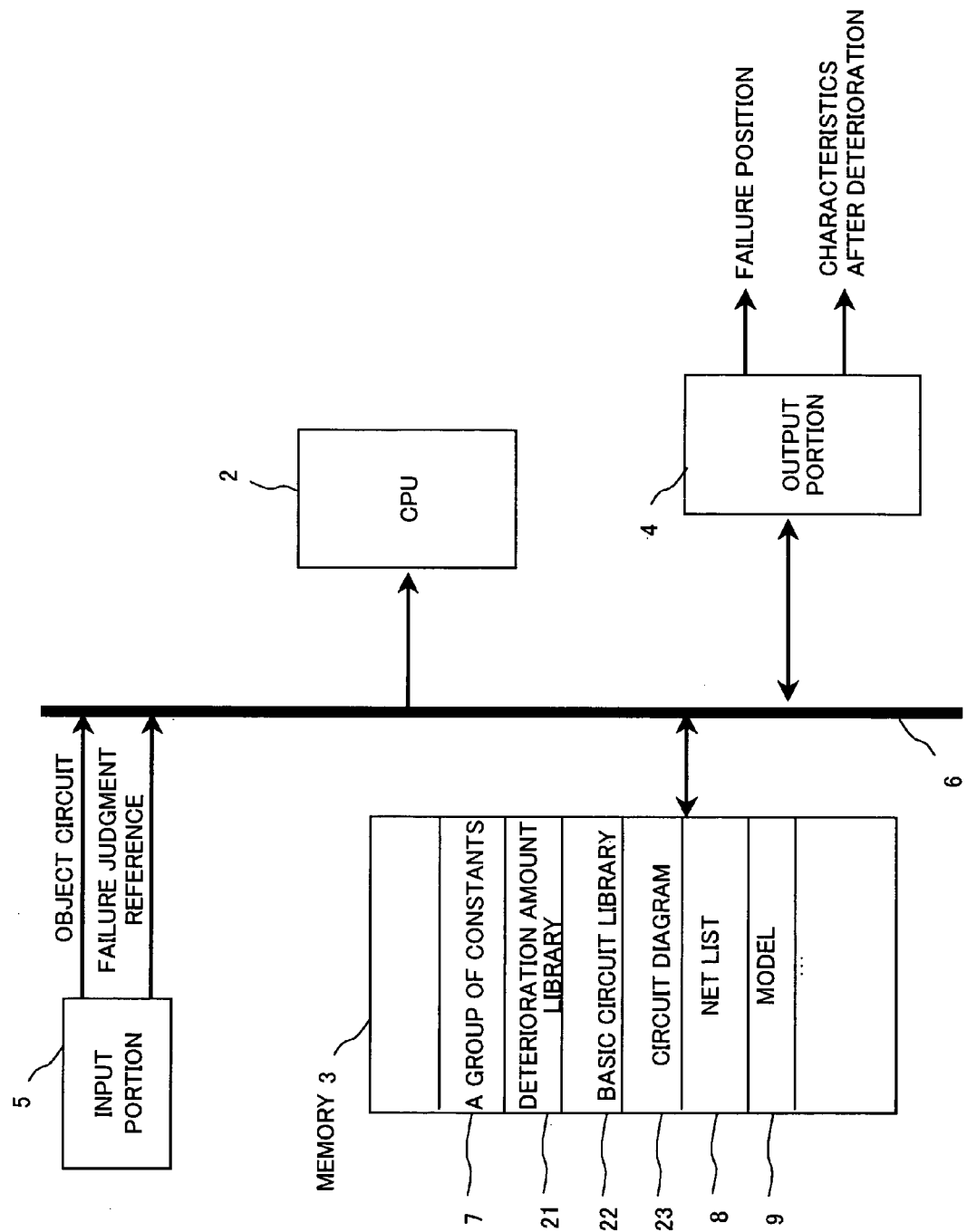
FIG. 11 is a view showing the configuration of a semiconductor device characteristics simulator according to a fourth embodiment of the present invention.

FIG. 11 is a view showing the configuration of a semiconductor characteristics simulator 20 according to the fourth embodiment.

The configuration of the semiconductor characteristics simulator 20 is basically the same as that of the semiconductor characteristics simulator 1 in the third embodiment illustrated in FIG. 5. Note that data stored in the memory and required for calculation are different. Also, an operation procedure of the overall simulator is different from that of the semiconductor characteristics simulator 1 illustrated in FIG. 5.

In the fourth embodiment, the same reference numbers are used for the same components as those in the third embodiment.

The semiconductor characteristics simulator 20 comprises, for example, a processor (CPU) 2, a memory 3 for storing simulation models and data necessary for simulations, an input portion 4 for receiving as an input necessary conditions for simulations, an output portion 5 for outputting results of simulations, and a bus 6 for connecting between the processor 2, the memory 3, the input portion 4 and the output portion 5.

Note that the semiconductor characteristics simulator 1 illustrated in FIG. 5 may include a plurality of the above configurations.

The memory 3 stores, in addition to a group of constants obtained by experiments necessary for simulations, a net list 8 as data of a connection relationship of an object circuit subjected to the simulations, and a model 9 for performing the simulation, a deterioration amount library 21 as deterioration amount data created from results of simulations performed on the transistor in advance, a basic circuit library 22 as data of the basic circuit composing the object circuit to be a very-large-scale integrated circuit as an object of the simulations, and circuit diagram data 23 indicating the circuit configuration of the object circuit, etc.

Use conditions of the object circuit of the simulations, such as an operation temperature, heating temperature and other temperatures, a gate voltage and other voltage in the characteristics test steps of the semiconductor circuit device, and a passage of time under such conditions are input from the input portion 4 to the processor 2. Also, a permissive deterioration value is input from the input portion 4 to the processor 2 as a failure judgment reference.

The output portion 5 outputs a failure position and characteristics after deterioration found as a result of the simulations by the processor 2.

Also, to determine the group of constants necessary for the simulations, experimental data is measured, and a measurement means for calculating the constants, such as the measurement device 11 and the measurement device control portion 12, are provided and connected to the semiconductor characteristics simulator 20.

As the deterioration amount library 21, a deterioration amount is configured or prepared in advance for each of basic circuit groups. The deterioration amount library 21 may be created, for example, from the results of deterioration simulations of other circuits from the previously tested transistors as explained as the third embodiment, or the library may be created by calculating deterioration amounts on an assumption that all transistors deteriorate to maximum. This can be easily calculated, for example, by using the formulas 30 and 31.

The library in the simulator 20 comprises the deterioration amount library 21 and the basic circuit library 22 composed of data of basic circuit groups, and deterioration of characteristics of the object circuit to be a circuit diagram 23 is calculated with high accuracy at a high speed by using the deterioration amount library 21 and the basic circuit library 22.

Figure 12:
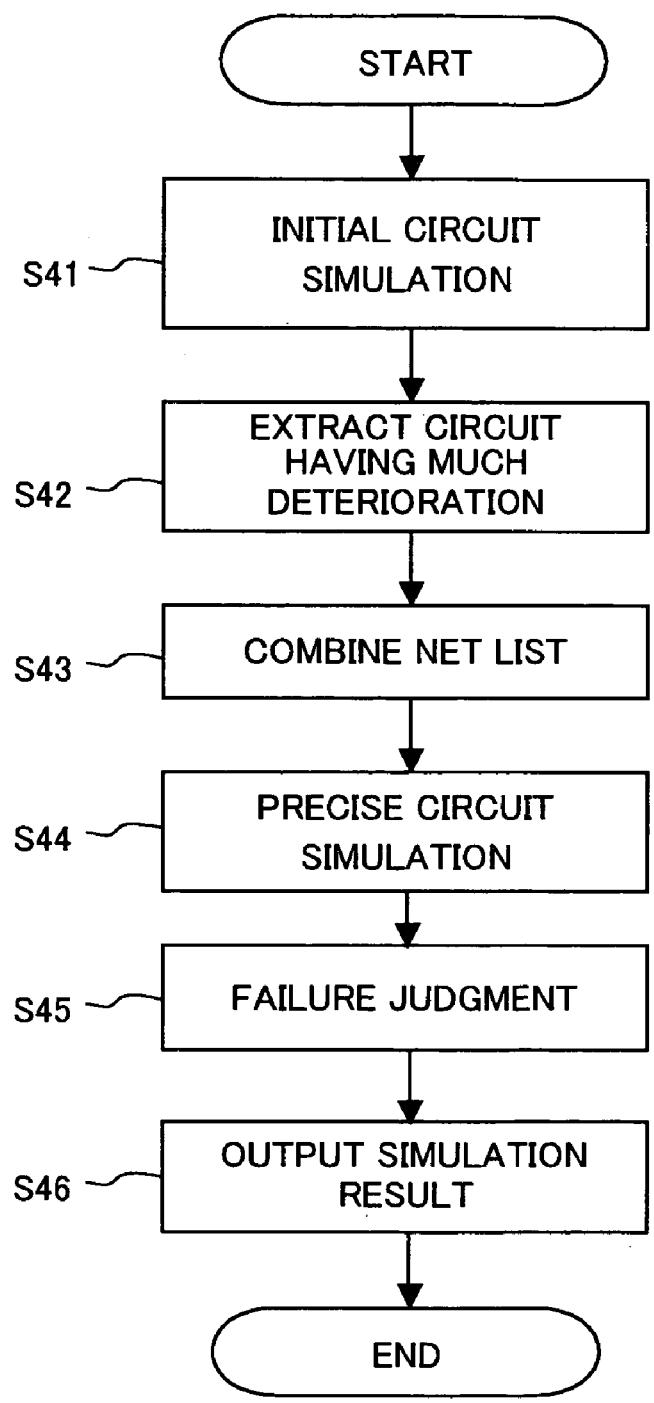
FIG. 12 is a flowchart showing a content of calculation processing of the semiconductor device characteristics simulator according to the fourth embodiment of the present invention.

A processing content of the semiconductor characteristics simulator 20 will be explained with reference to the flowchart in FIG. 12. FIG. 12 is a flowchart showing a content of calculation processing of the semiconductor characteristics simulator 20.

As the overall processing operation in the semiconductor characteristics simulator 20, a reference destination of the simulation model 8 of an object circuit subjected to the simulation, for example, a reference destination of parameters of a SPICE circuit simulation of the transistor is input first. Next, the simulation model 8 is executed and simulations on the deterioration and recovery amounts of characteristics of the object circuit and characteristics of the transistor composing the same start.

Step S41: Simulation of Initial Circuit

The processor 2 performs an initial circuit simulation by using the model 9 prior to performing simulations of the precision circuit in a step S44.

Specifically, the processor 2 uses the deterioration amount library 21 and the basic circuit library 22, and calculates deterioration amounts of the basic circuits at a high speed for the object circuit to be the circuit diagram 23 composed of a group of basic circuits included in the basic circuit library 22.

Step S42: Extraction of Circuit with Much Deterioration

The processor 2 extracts only a circuit wherein a deterioration amount of the input failure judgment reference shows an unignorablly large deterioration amount. The processor 2 also extracts an operation waveform and an operation pattern of the object circuit at the same time.

Step S43: Combining Net List

The processor 2 combines the net list 8, so that, for example, a SPICE simulation can performed by the extracted circuit, the operation waveform and the basic circuit library 22.

Step S44: Precise Simulation

The processor 2 uses the net list 8 stored in the memory 3 to perform more accurate (precise) circuit simulation, for example, as explained as the second embodiment.

Step S45: Failure Judgment

The processor 2 performs failure judgment on the circuit by using the input failure judgment reference based on the results of precise circuit simulation in the step S44.

Step S46: Outputting Simulation Results

The processor 2 outputs as judgment results of the simulation results a position judged to be a failure and a delay value of the circuit after deterioration, for example, based on the failure judgment results from the output portion 5.

According to the fourth embodiment, a deterioration amount and recovery amount can be accurately simulated at a high speed also for a very-large-scale integrated circuit in the same way as in the third embodiment.

Namely, according to the fourth embodiment of the present invention, in the same way as in the third embodiment, by dealing with a phenomenon of deterioration and recovery in the deterioration phenomenon, simulation results, that is, a deterioration amount and a recovery amount close to characteristics of the actual circuit, and a reliability deterioration margin can be given at a high speed in an optimal way when designing a further miniaturized semiconductor circuit.

According to the fourth embodiment, being different from the conventional calculation formula for obtaining a deterioration amount, results close to a deterioration amount and a recovery amount of an actual transistor circuit can be obtained by dividing to time zones and calculating a suitable deterioration amount and recovery amount for each time zone. In many cases, the deterioration amount obtained by the present embodiment is decreased comparing with a deterioration amount obtained by the conventional method.

According to the present embodiment, by considering changes of characteristics deterioration, a more accurate deterioration amount can be simulated. A deterioration amount obtained in the present embodiment in this way is increased in many cases.

According to the present embodiment, by considering recovery of transistor characteristics, the final deterioration amount can be more accurately simulated. A deterioration amount obtained in this way in the present embodiment is widely decreased in many cases.

According to the present embodiment, by considering a plurality of use conditions from production of the semiconductor device to use by a user, a more accurate deterioration amount and recovery amount can be simulated, and a deterioration amount can be widely reduced comparing with a deterioration amount obtained by considering only one step.

Furthermore, according to embodiments of the present invention, even in the case of a very-large-scale integrated circuit, a deterioration amount and a recovery amount can be accurately simulated at a high speed.

As explained above, by accurately simulating a reliability deterioration margin of a transistor circuit, dimensions of a MIS transistor can be made small when a deterioration amount obtained by the present embodiments becomes smaller than a deterioration amount obtained by the prior art. As a result, a wafer occupying area in the product can be reduced, so that the number of products able to be produced per one wafer is increased and the production const can be reduced.

On the other hand, when the deterioration amount obtained by the present embodiment becomes larger than that obtained by the method of the prior art, it is possible to design a circuit wherein a countermeasure is taken so that the product can be normally used through a predetermined lifetime by considering reliability.

As explained above, preferred embodiments of the present invention were explained, but the present invention is not limited to the above explained embodiments and may be variously modified within the scope of the present invention.

The invention claimed is:

1. A simulation method of a semiconductor circuit device for simulating characteristics of a circuit when a negative bias voltage and a bias free voltage are applied to a semiconductor circuit including a metal insulator semiconductor transistor by using a calculation processing means, comprising:
   a step of obtaining a basic deterioration amount ($X_D$) of characteristics of said transistor depending on a negative bias voltage applied to said transistor, an operation temperature of said transistor, and a time passed after forming said transistor;
   a step of calculating a deterioration amount ($\Delta P_D$) that said transistor deteriorates along with a duration of applying a negative bias voltage in a first period wherein said negative bias voltage is applied to said transistor;
   a step of calculating a recovery amount ($\Delta P_R$) that characteristics of said deteriorated transistor along with a duration of a second period wherein application of said negative bias voltage to said transistor is terminated or a bias free voltage of a higher level than that of said negative bias voltage is applied to said transistor;
   a step of calculating a total deterioration amount (P) by adding said basic deterioration amount ($X_D$) and said deterioration amount ($\Delta P_D$) and subtracting said recovery amount ($\Delta P_R$) from the addition result;
   a step of selecting only a transistor having a larger total deterioration amount than a predetermined set value from a plurality of transistors based on total deterioration amounts of the respective transistors obtained in said step of obtaining a basic deterioration; and
   a step of performing a characteristics simulation on the selected transistor.

2. A simulation method as set forth in claim 1, wherein a change amount ($\exp(\beta(Vgj-Vg0) \times \Delta tj)$) of a deterioration amount up to a lifetime "1t" is calculated for each time zone ($\Delta tj$) obtained by dividing a passage of time to a plurality (j) of time zones, and a total deterioration amount (P) is calculated based on:

$$\text{time} = e^{Q/k \cdot (1/T0 - 1/T)} \cdot e^{\alpha} \cdot \sum_{j=1}^{lt} (e^{\beta \cdot (Vgj - Vg0)} \cdot \Delta t_j)$$

$$P = C \cdot \sum_{k=1}^{} [time^n]_{time=stime_k}^{time=etime_k}$$

where "Q" is a constant indicating characteristics of a transistor,
"k" is the Boltzmann constant,
"T0" is a reference absolute operation temperature (K) of the transistor,
"T" is an absolute operation temperature of the transistor,
"$\alpha$" and "$\beta$" are constants obtained from experiments,
"Vg0" is a reference gate voltage,
"Vgj" is a gate voltage at time "j",
"C" is a constant, and
"1t" is a lifetime.

3. The simulation method as set forth in claim 1 or 2, wherein it is judged in said second step whether said transistor is deteriorated due to application of said negative bias voltage, and calculation of said deterioration amount ($\Delta P_D$) is executed when deterioration arises.

4. The simulation method as set forth in claim 3, wherein said step of calculating a deterioration amount ($\Delta P_D$) is executed based on:

$$\Delta PD(t) = CD + BD \times \log(t)$$

where "$C_D$" and "$B_D$" are constants defined by depending on a negative bias voltage, and defined by the formulas below, and
"t" is a passage of time after applying the negative bias voltage, $$C_D = C_{DV} e^{n_{CV}/Vg}$$

$$B_D = B_{DV} e^{n_{BV}/Vg}$$

or $$C_D = C_{DV} e^{\alpha_{CV} + \beta_{CV} \cdot Vg}$$

$$B_D = B_{DV} e^{\alpha_{BV} + \beta_{BV} \cdot Vg}$$

where "$C_{DV}$" and "$B_{DV}$" are constants obtained from experiments,
"$n_{cv}$" and "$n_{Bv}$" are constants obtained from experiments,
"$\alpha_{cv}$", "$\beta_{cv}$", "$\alpha_{Bv}$" and "$\beta_{Bv}$" are constants obtained from experiments, and
"Vg" is a gate voltage as a negative bias voltage applied to the transistor.

5. The simulation method as set forth in claim 3, wherein said step of calculating a deterioration amount ($\Delta P_D$) is executed based on:

$$\Delta PD(t) = CD + BD \times \log(t)$$

where "$C_D$" and "$B_D$" are constants defined by depending on a negative bias voltage, and defined by the formulas below, and
"t" is a passage of time after applying the negative bias voltage, $$C_D = C_{DV}(e^{n_{CV}/Vg} \pm C_{DVP} e^{n_{CVP}/Vgp})$$

$$B_D = B_{DV}(e^{n_{BV}/Vg} \pm B_{DVP} e^{n_{BVP}/Vgp})$$

Or $$C_D = C_{DV}(e^{\alpha_{CV} + \beta_{CV} \cdot Vg} \pm C_{DVP} e^{\alpha_{CVP} + \beta_{CVP} \cdot Vgp})$$

$$B_D = B_{DV}(e^{\alpha_{BV} + \beta_{BV} \cdot Vg} \pm B_{DVP} e^{\alpha_{BVP} + \beta_{BVP} \cdot Vgp})$$

where "$C_{DV}$" and "$B_{DV}$" are constants obtained from experiments,
"$n_{CV}$" and "$n_{BV}$" are constants obtained from experiments,
"$\alpha cv$", "$\beta cv$", "$\alpha Bv$" and "$\beta Bv$" are constants obtained from experiments, and
"Vg" is a gate voltage as a negative bias voltage applied to the transistor.

6. The simulation method as set forth in claim 3, wherein said step of calculating a deterioration amount ($\Delta P_D$) is executed based on:

$$\Delta PD(t) = CD + BD \times \log(t)$$

where "$C_D$" and "$B_D$" are constants defined by depending on a negative bias voltage and a temperature of said transistor, and defined by the formulas below, and "t" is a passage of time after applying the negative bias voltage, $$C_D = C_{DV} e^{n_{CV}/Vg}$$

$$B_D = B_{DV} e^{n_{BV}/Vg}$$

Or $$C_D = C_{DV} e^{\alpha_{CV} + \beta_{CV} \cdot Vg}$$

$$B_D = B_{DV} e^{\alpha_{BV} + \beta_{BV} \cdot Vg}$$

where "$C_{DV}$" and "$B_{DV}$" are constants defined by a temperature of said transistor in operation, and defined by the formulas below, "$n_{cv}$" and "$n_{Bv}$" are constants obtained from experiments, "$\alpha_{cv}$", "$\beta_{cv}$", "$\alpha_{Bv}$" and "$\beta_{Bv}$" are constants obtained from experiments, and "Vg" is a gate voltage as a negative bias voltage applied to the transistor, $$C_{DV} = C_{DVT} \cdot e^{Q_{DC}/k \cdot (1/T0 - 1/T)}$$

$$B_{DV} = B_{DVT} \cdot e^{Q_{DB}/k \cdot (1/T0 - 1/T)}$$

where "$C_{DVT}$", "$Q_{DC}$", "$B_{DVT}$" and "$Q_{DB}$" are constants obtained from experiments, wherein "T" is an absolute operation temperature of the transistor, "T0" is a reference absolute operation temperature of the transistor, and "k" is the Boltzmann constant.

7. The simulation method as set forth in claim 3, wherein it is judged in said step of calculating a recovery amount whether recovery of deterioration of said transistor due to application of said bias free voltage arises or not, and calculation of the recovery amount ($\Delta P_R$) is executed when recovery arises.

8. The simulation method as set forth in claim 7, wherein said step of calculating a recovery amount ($\Delta P_R$) is executed based on:

$$\Delta PR = CR + BR \times \log(t)$$

where "$C_R$" and "$B_R$" are constants defined by the formulas:

$$C_R = C_{RVM} e^{n_{CRVM}/Vgm}$$

$$B_R = B_{RVM} e^{n_{RBVM}/Vgm}$$

Or $$C_R = C_{RVM} e^{\alpha_{CRVM} + \beta_{CRVM} \cdot Vgm}$$

$$B_R = B_{RVM} e^{\alpha_{BRVM} + \beta_{BRVM} \cdot Vgm}$$

where "$C_{RVM}$" and "$B_{RVM}$" are constants obtained from experiments,

"$n_{CRVM}$" and "$n_{BRVM}$" are constants obtained from experiments,

"$\alpha_{cRVM}$" and "$\alpha_{BRVM}$" are constants obtained from experiments, "βcRVM" and "$\beta_{BRVM}$" are constants obtained from experiments, and "Vgm" is a maximum gate voltage in a period of applying a negative bias voltage.

9. The simulation method as set forth in claim 7, wherein said step of calculating a recovery amount ($\Delta P_R$) is executed based on:

$$\Delta PR = CR + BR \times \log(t)$$

where "$C_R$" and "$B_R$" are constants defined by:

$$C_R = C_{RVM}(e^{n_{CRVM}/Vgm} \pm C_{RV} e^{n_{CRV}/Vg})$$

$$B_R = B_{RVM}(e^{n_{RBVM}/Vgm} \pm B_{RV} e^{n_{BRV}/Vg})$$

Or $$C_R = C_{RVM}(e^{\alpha_{CRVM} + \beta_{CRVM} \cdot Vgm} \pm C_{RV} e^{\alpha_{CRV} + \beta_{CRV} \cdot Vg})$$

$$B_R = B_{RVM}(e^{\alpha_{BRVM} + \beta_{BRVM} \cdot Vgm} \pm B_{RV} e^{\alpha_{BRV} + \beta_{BRV} \cdot Vg})$$

where "$C_{RVM}$" and "$B_{RVM}$" are constants obtained from experiments,

"$n_{CRVM}$" and "$n_{BRVM}$" are constants obtained from experiments,

"$\alpha_{cRVM}$" and "$\alpha_{BRVM}$" are constants obtained from experiments, "$\beta_{cRVM}$" and "$\beta_{BRVM}$" are constants obtained from experiments, "αcRV" and "$\alpha_{BRV}$" are constants obtained from experiments, "$\beta_{cRV}$" and "$\beta_{BRV}$" are constants obtained from experiments, and "Vgm" is a maximum gate voltage in a period of applying a negative bias voltage.

10. The simulation method as set forth in claim 8, wherein said step of calculating a recovery amount ($\Delta P_R$) is executed based on:

$$\Delta PR = CR + BR \times \log(t)$$

where "$C_R$" and "$B_R$" are constants defined by:

$$C_R = C_{RVM} e^{n_{CRVM}/Vgm}$$

$$B_R = B_{RVM} e^{n_{RBVM}/Vgm}$$

Or $$C_R = C_{RVM} e^{\alpha_{CRVM} + \beta_{CRVM} \cdot Vgm}$$

$$B_R = B_{RVM} e^{\alpha_{BRVM} + \beta_{BRVM} \cdot Vgm}$$

where "$C_{RVM}$" and "$B_{RVM}$" are constants depending on a temperature of the transistor, and defined by the formulas below, "$n_{CRVM}$" and "$n_{BRVM}$" are constants obtained from experiments, "$\alpha_{cRVM}$" and "$\alpha_{BRVM}$" are constants obtained from experiments, "$\beta_{cRVM}$" and "$\beta_{BRVM}$" are constants obtained from experiments, "Vgm" is a maximum gate voltage in a period of applying a negative bias voltage.

$$C_{RVM} = C_{RVMT} \cdot e^{Q_{RC}/k \cdot (1/T0 - 1/T)}$$

$$B_{RVM} = B_{RVMT} \cdot e^{Q_{RB}/k \cdot (1/T0 - 1/T)}$$

where "$C_{DVT}$", "$Q_{DC}$", $B_{DVT}$" and "$Q_{DB}$" are constants obtained from experiments, wherein "T" is an absolute operation temperature of the transistor, "T0" is a reference absolute operation temperature of the transistor, and "k" is the Boltzmann constant.

11. The simulation method as set forth in claim 3, wherein when characteristics of said transistor is deteriorated to a predetermined permissive deterioration value, an accumulated time until reaching to the deterioration value is output as a lifetime of the transistor in said first step of obtaining a deterioration amount.

12. The simulation method as set forth in claim 1 or 2, further comprising:
   a step of creating a deterioration amount table of transistors from deterioration amounts of a plurality of transistors obtained in said step of obtaining a deteriorating amount; and
   a step of referring to said deterioration amount table and obtaining a deterioration amount for each of a plurality of basic circuits each composed of a metal insulator semiconductor transistor.

13. The simulation method as set forth in claim 1 or 2, further comprising a step of successively calculating characteristics deterioration and characteristics recovery of each transistor for a series of plurality of gate voltage conditions of said respective transistors and operation temperature conditions of a plurality of transistors.

14. The simulation method as set forth in claims 1 or 2, further comprising a step of calculating said recovery amount by setting a new gate voltage when characteristics of said transistor are recovered to a predetermined value.

15. A simulation method for simulating characteristics of a circuit when applying a negative bias voltage and a bias free voltage to a semiconductor circuit device including a metal insulator semiconductor transistor, comprising:
   a condition input step of inputting a use condition of said semiconductor circuit device;
   a step of simulating a circuit before deterioration by performing a simulation of an operation of a transistor in said semiconductor circuit device based on said input use condition and calculating an effective gate voltage of said transistor;
   a deterioration amount simulation step by calculating a deterioration amount ($\Delta P_D$) and a recovery amount ($\Delta P_R$) of characteristics of said transistor, calculating a lifetime of said transistor and calculating a total deterioration amount (P);
   a step of calculating characteristics of said transistor after deterioration and simulating an operation of said semiconductor circuit device; and
   a step of outputting results of said simulation.

16. A simulator for performing a simulation of characteristics of a circuit when applying a negative bias voltage and a bias free voltage to a semiconductor circuit device including a metal insulator semiconductor transistor, comprising:
   first calculation means for obtaining a basic deterioration amount ($X_D$) of characteristics of said transistor depending on a negative bias voltage applied to said transistor, an operation temperature of said transistor, and a time passed after forming said transistor;
   second calculation means for calculating a deterioration amount ($\Delta P_D$) that said transistor deteriorates along with a duration of applying said negative bias voltage in a first period wherein a negative bias voltage is applied to said transistor;
   third calculation means for calculating a recovery amount ($\Delta P_R$) that characteristics of said deteriorated transistor are recovered along with a duration of a second period wherein application of said negative bias voltage to said transistor is terminated or a bias free voltage of a higher level than that of said negative bias voltage is applied to said transistor;
   fourth calculation means for calculating a total deterioration amount (P) by adding said basic deterioration amount ($X_D$) and said deterioration amount ($\Delta P_D$) and subtracting said recovery amount ($\Delta P_R$) from the addition result;
   fifth calculation means for selecting only a transistor having a larger total deterioration amount than a predetermined set value from a plurality of transistors based on total deterioration amounts of the respective transistors obtained by said first calculation means; and
   means for performing characteristics simulations again on the selected transistor.

17. The simulator as set forth in claim 16, wherein said first calculation means calculates a change amount ($\exp(\beta (V_{gj}-V_{g0}) \times \Delta t_j)$) of a deterioration amount for each time zone ($\Delta t_j$) obtained by dividing a passage of time to a plurality (j) of time zones, and calculates a total deterioration amount (P) based on:

$$\text{time} = e^{Q/k \cdot (1/T0 - 1/T)} \cdot e^\alpha \cdot \sum_{j=1}^{lt} (e^{\beta \cdot (Vgj - Vg0)} \cdot \Delta t_j)$$

$$P = C \cdot \sum_{k=1}^{} [\text{time}^n]_{time=stime_k}^{time=etime_k}$$

where "Q" is a constant indicating characteristics of a transistor,
"k" is the Boltzmann constant,
"T0" is a reference absolute operation temperature (K) of the transistor,
"T" is an absolute operation temperature,
"$\alpha$" and "$\beta$" are constants obtained from experiments,
"Vg0" is a reference gate voltage,
"Vgj" is a gate voltage at time "j",
"C" is a constant, and
"1t" is a lifetime.

18. The simulator as set forth in claim 16 or 17, wherein said second calculation means judges whether said transistor is deteriorated due to application of said negative bias voltage and executes calculation of said deterioration amount ($\Delta P_D$) when deterioration arises.

19. The simulator as set forth in claim 18, wherein calculation of a deterioration amount ($\Delta P_D$) in said second calculation means is executed based on:

$\Delta PD(t) = CD + BD \times \log(t)$ where "$C_D$" and "$B_D$" are constants defined by depending on a negative bias voltage, and defined by the formulas below, and
"t" is a passage of time after applying the negative bias voltage, $C_D = C_{DV} e^{n_{CV}/Vg}$ $B_D = B_{DV} e^{n_{BV}/Vg}$ or $C_D = C_{DV} e^{\alpha_{CV} + \beta_{CV} \cdot Vg}$ $B_D = B_{DV} e^{\alpha_{BV} + \beta_{BV} \cdot Vg}$ where "$C_{DV}$" and "$B_{DV}$" are constants obtained from experiments,
"$n_{cv}$" and "$n_{Bv}$" are constants obtained from experiments,
"$\alpha_{cv}$", "$\beta_{cv}$", "$\alpha_{Bv}$" and "$\beta_{Bv}$" are constants obtained from experiments, and
"Vg" is a gate voltage as a negative bias voltage applied to the transistor.

20. The simulator as set forth in claim 18, wherein said second calculation means executes calculation of a deterioration amount ($\Delta P_D$) based on:

$\Delta PD(t) = CD + BD \times \log(t)$ where "$C_D$" and "$B_D$" are constants defined by depending on a negative bias voltage, and defined by the formulas below, and "t" is a passage of time after applying the negative bias voltage, $$C_D = C_{DV}(e^{n_{CV}/Vg} \pm C_{DVP}e^{n_{CVP}/Vgp})$$

$$B_D = B_{DV}(e^{n_{BV}/Vg} \pm B_{DVP}e^{n_{BVP}/Vgp})$$

Or $$C_D = C_{DV}(e^{\alpha_{CV}+\beta_{CV}\cdot Vg} \pm C_{DVP}e^{\alpha_{CVP}+\beta_{CVP}\cdot Vgp})$$

$$B_D = B_{DV}(e^{\alpha_{BV}+\beta_{BV}\cdot Vg} \pm B_{DVP}e^{\alpha_{BVP}+\beta_{BVP}\cdot Vgp})$$

where "$C_{DV}$" and "$B_{DV}$" are constants obtained from experiments,

"$n_{cv}$" and "$n_{Bv}$" are constants obtained from experiments,

"$\alpha_{cv}$", "$\beta_{cv}$", "$\alpha_{Bv}$" and "$\beta_{Bv}$" are constants obtained from experiments, and "Vg" is a gate voltage as a negative bias voltage applied to the transistor.

21. The simulation method as set forth in claim 18, wherein said second calculation means executes calculation of a deterioration amount ($\Delta P_D$) based on:

$$\Delta PD(t) = CD + BD \times \log(t)$$

where "$C_D$" and "$B_D$" are constants defined by depending on a negative bias voltage and a temperature of said transistor, and defined by the formulas below, and "t" is a passage of time after applying the negative bias voltage, $$C_D = C_{DV}e^{n_{CV}/Vg}$$

$$B_D = B_{DV}e^{n_{BV}/Vg}$$

Or $$C_D = C_{DV}e^{\alpha_{CV}+\beta_{CV}\cdot Vg}$$

$$B_D = B_{DV}e^{\alpha_{BV}+\beta_{BV}\cdot Vg}$$

where "$C_{DV}$" and "$B_{DV}$" are constants defined by a temperature of said transistor in operation, and defined by the formulas below, "$n_{cv}$" and "$n_{Bv}$" are constants obtained from experiments, "$\alpha_{cv}$", "$\beta_{cv}$", "$\alpha_{Bv}$" and "$\beta_{Bv}$" are constants obtained from experiments, and "Vg" is a gate voltage as a negative bias voltage applied to the transistor, $$C_{DV} = C_{DVT}e^{Q_{DC}/k \cdot (1/T0 - 1/T)}$$

$$B_{DV} = B_{DVT}e^{Q_{DB}/k \cdot (1/T0 - 1/T)}$$

where "$C_{DVT}$", "$Q_{DC}$", "$B_{DVT}$" and "$Q_{DB}$" are constants obtained from experiments, wherein "T" is an absolute operation temperature of the transistor, "T0" is a reference absolute operation temperature of the transistor, and "k" is the Boltzmann constant.

22. The simulator as set forth in claim 16 or 17, wherein said third calculation means judges whether recovery of deterioration of said transistor due to application of said bias free voltage arises and executes calculation of the recovery amount ($\Delta P_R$) when recovery arises.

23. The simulator as set forth in claim 22, wherein said third calculation means executes calculation of a recovery amount ($\Delta P_R$) based on:

$$\Delta PR = CR + BR \times \log(t)$$

where "$C_R$" and "$B_R$" are constants defined by:

$$C_R = C_{RVM}e^{n_{CRVM}/Vgm}$$

$$B_R = B_{RVM}e^{n_{BRVM}/Vgm}$$

Or $$C_R = C_{RVM}e^{\alpha_{CRVM}+\beta_{CRVM}\cdot Vgm}$$

$$B_R = B_{RVM}e^{\alpha_{BRVM}+\beta_{BRVM}\cdot Vgm}$$

where "$C_{RVM}$" and "$B_{RVM}$" are constants obtained from experiments,

"$n_{CRVM}$" and "$n_{BRVM}$" are constants obtained from experiments,

"$\alpha_{cRVM}$" and "$\alpha_{BRVM}$" are constants obtained from experiments, "$\beta_{cRVM}$" and "$\beta_{BRVM}$" are constants obtained from experiments, and "Vgm" is a maximum gate voltage in a period of applying a negative bias voltage.

24. The simulator as set forth in claim 22, wherein said third calculation means executes calculation of a recovery amount ($\Delta P_R$) based on:

$$\Delta PR = CR + BR \times \log(t)$$

where "$C_R$" and "$B_R$" are constants defined by:

$$C_R = C_{RVM}(e^{n_{CRVM}/Vgm} \pm C_{RV}e^{n_{CRV}/Vg})$$

$$B_R = B_{RVM}(e^{n_{RBVM}/Vgm} \pm B_{RV}e^{n_{BRV}/Vg})$$

Or $$C_R = C_{RVM}(e^{\alpha_{CRVM}+\beta_{CRVM}\cdot Vgm} \pm C_{RV}e^{\alpha_{CRV}+\beta_{CRV}\cdot Vg})$$

$$B_R = B_{RVM}(e^{\alpha_{BRVM}+\beta_{BRVM}\cdot Vgm} \pm B_{RVP}e^{\alpha_{BRV}+\beta_{BRV}\cdot Vg})$$

where "$C_{RVM}$" and "$B_{RVM}$" are constants obtained from experiments,

"$n_{CRVM}$" and "$n_{BRVM}$" are constants obtained from experiments,

"$\alpha_{cRVM}$" and "$\alpha_{BRVM}$" are constants obtained from experiments, "$\beta_{cRVM}$" and "$\beta_{BRVM}$" are constants obtained from experiments, "$\alpha_{cRV}$" and "$\alpha_{BRV}$" are constants obtained from experiments, "$\beta_{cRV}$" and "$\beta_{BRV}$" are constants obtained from experiments, and "Vgm" is a maximum gate voltage in a period of applying a negative bias voltage.

25. The simulator as set forth in claim 22, wherein said third calculation means executes calculation of a recovery amount ($\Delta P_R$) based on:

$$\Delta PR = CR + BR \times \log(t)$$

where "$C_R$" and "$B_R$" are constants defined by:

$$C_R = C_{RVM}e^{n_{CRVM}/Vgm}$$

$$B_R = B_{RVM}e^{n_{BRVM}/Vgm}$$

Or $$C_R = C_{RVM}e^{\alpha_{CRVM}+\beta_{CRVM}\cdot Vgm}$$

$$B_R = B_{RVM}e^{\alpha_{BRVM}+\beta_{BRVM}\cdot Vgm}$$

where "$C_{RVM}$" and "$B_{RVM}$" are constants depending on a temperature of the transistor, and defined by the formulas below, "$n_{CRVM}$" and "$n_{BRVM}$" are constants obtained from experiments, "$\alpha_{cRVM}$" and "$\alpha_{BRVM}$" are constants obtained from experiments, "$\beta_{cRVM}$" and "$\beta_{BRVM}$" are constants obtained from experiments, "Vgm" is a maximum gate voltage in a period of applying a negative bias voltage, $$C_{RVM}=C_{RVMT}\cdot e^{Q_{RC}/k\cdot(1/T0-1/T)}$$

$$B_{RVM}=B_{RVMT}\cdot e^{Q_{RB}/k\cdot(1/T0-1/T)}$$

where "$C_{RVMT}$", "$Q_{RC}$", $B_{RVMT}$" and "$Q_{RB}$" are constants obtained from experiments, wherein "T" is an absolute operation temperature of the transistor, "T0" is a reference absolute operation temperature of the transistor, and "k" is the Boltzmann constant.

26. The simulator as set forth in claims 16 or 17, wherein when characteristics of said transistor is deteriorated to a predetermined permissive deterioration value, said first calculation means outputs an accumulated time until reaching to the deterioration value as a lifetime of the transistor.

27. The simulator as set forth in claim 16 or 17, further comprising:

a sixth calculation means for creating a deterioration amount table of transistors from deterioration amounts of a plurality of transistors obtained by said first calculation means; and seventh calculation means for referring to said deterioration amount table and obtaining a deterioration amount for each of a plurality of basic circuits each composed of a metal insulator semiconductor transistor.

28. The simulator as set forth in claim 27, further comprising eighth calculation means for successively calculating characteristics deterioration and characteristics recovery of each transistor for a series of plurality of gate voltage conditions of said respective transistors and operation temperature conditions of a plurality of transistors.

29. The simulator as set forth in claims 28, further comprising ninth calculation means for calculating said recovery amount by setting a new gate voltage when detecting that characteristics of said transistor is recovered to a predetermined value.

30. A simulation method for simulating characteristics of a circuit when applying a negative bias voltage and a bias free voltage to a semiconductor circuit device including a metal insulator semiconductor transistor, comprising:

a condition input step of inputting a use condition of said semiconductor circuit device;

a step of simulating a circuit before deterioration by performing a simulation of an operation of a transistor in said semiconductor circuit device based on said input use condition and calculating an effective gate voltage of said transistor;

a deterioration amount simulation step of calculating a deterioration amount ($\Delta P_D$) and a recovery amount ($\Delta P_R$) of characteristics of said transistor, calculating a lifetime of said transistor and calculating a total deterioration amount (P);

a step for calculating characteristics of said transistor after deterioration and simulating an operation of said semiconductor circuit device; and a step for outputting results of said simulation.

* * * * *

UNITED STATES PATENT AND TRADEMARK OFFICE
CERTIFICATE OF CORRECTION

PATENT NO. : 7,240,308 B2
APPLICATION NO. : 10/502621
DATED : July 3, 2007
INVENTOR(S) : Hiroki Usui It is certified that error appears in the above-identified patent and that said Letters Patent is hereby corrected as shown below:

In Column 2, Line 49, "setting" should read --set--;

In Column 10, Line 43, "actual" should read --actuality--;

In Column 12, Line 66, "formulas" should read --formula--;

In Column 13, Line 19, "SO" should read --so--;

In Column 14, Lines 24-25, "calculates" should read --calculate--;

In Column 16, Line 8, "are" should read --is--;

In Column 18, Lines 46 and 48, "measures" should read --measure--;

In Column 18, Line 50, "outputs" should read --output--;

In Column 19, Line 44, "Si" should read --S1--;

In Column 24, Line 64, "const" should read --costs--;

In Column 25, Line 36, "$(\Delta P_D)$" should read --$(\Delta P_R)$--;

In Column 26, Line 11, "$\Delta PD (t) = CD + BD \times \log (t)$" should read --$\Delta P_D (t) = C_D + B_D \times \log (t)$--;

In Column 26, Line 37, "$\Delta PD (t) = CD + BD \times \log (t)$" should read --$\Delta P_D (t) = C_D + B_D \times \log (t)$--;

In Column 26, Line 66, "$\Delta PD (t) = CD + BD \times \log (t)$" should read --$\Delta P_D (t) = C_D + B_D \times \log (t)$--;

In Column 27, Line 41, "$\Delta PR = CR + BR \times \log (t)$" should read --$\Delta P_R = C_R + B_R \times \log (t)$--;

In Column 27, Line 59, "$\beta cRVM$" should read --$\beta_{cRVM}$--;

UNITED STATES PATENT AND TRADEMARK OFFICE
CERTIFICATE OF CORRECTION

PATENT NO. : 7,240,308 B2
APPLICATION NO. : 10/502621
DATED : July 3, 2007
INVENTOR(S) : Hiroki Usui It is certified that error appears in the above-identified patent and that said Letters Patent is hereby corrected as shown below:

In Column 27, Line 66, "$\Delta PR = CR + BR \times \log(t)$" should read --$\Delta P_R = C_R + B_R \times \log(t)$--;

In Column 28, Line 21, "$\alpha_{cRV}$" should read --$\alpha_{cRV}$--;

In Column 28, Line 30, "$\Delta PR = CR + BR \times \log(t)$" should read --$\Delta P_R = C_R + B_R \times \log(t)$--;

In Column 28, Line 63, "is" should read --are--;

In Column 29, Line 1, "claim" should read --claims--;

In Column 29, Line 11, "claim" should read --claims--;

In Column 30, Line 33, "claim" should read --claims--;

In Column 30, Line 42, "$\Delta PR = CR + BR \times \log(t)$" should read --$\Delta P_R = C_R + B_R \times \log(t)$--;

In Column 30, Line 66, "$\Delta PD(t) = CD + BD \times \log(t)$" should read --$\Delta P_D(t) = C_D + B_D \times \log(t)$--;

In Column 31, Line 27, "$\Delta PD(t) = CD + BD \times \log(t)$" should read --$\Delta P_D(t) = C_D + B_D \times \log(t)$--;

In Column 31, Line 58, "claim" should read --claims--;

In Column 31, Line 66, "$\Delta PR = CR + BR \times \log(t)$" should read --$\Delta P_R = C_R + B_R \times \log(t)$--;

In Column 32, Line 24, "$\Delta PR = CR + BR \times \log(t)$" should read --$\Delta P_R = C_R + B_R \times \log(t)$--;

UNITED STATES PATENT AND TRADEMARK OFFICE
CERTIFICATE OF CORRECTION

PATENT NO. : 7,240,308 B2
APPLICATION NO. : 10/502621
DATED : July 3, 2007
INVENTOR(S) : Hiroki Usui It is certified that error appears in the above-identified patent and that said Letters Patent is hereby corrected as shown below:

In Column 32, Line 54, "$\Delta PR = CR + BR \times \log(t)$" should read --$\Delta P_R = C_R + B_R \times \log(t)$--;

In Column 33, Line 20, "is" should read --are--;

In Column 33, Line 24, "claim" should read --claims--;

In Column 33, Line 26, delete "a";

In Column 34, Line 7, "claims" should read --claim--; and

In Column 34, Line 10, "is" should read --are--.

Signed and Sealed this

Twenty-second Day of December, 2009

David J. Kappos
*Director of the United States Patent and Trademark Office*